(12) United States Patent
Kim et al.

(10) Patent No.: US 12,691,527 B2
(45) Date of Patent: Jul. 28, 2026

(54) MANUFACTURING METHOD FOR MASK

(71) Applicant: Samsung Display Co., Ltd., Yongin-si (KR)

(72) Inventors: Hwi Kim, Suwon-si (KR); Jeongkuk Kim, Suwon-si (KR); Seungyong Song, Suwon-si (KR); Areum Lee, Suwon-si (KR); Kyu Hwan Hwang, Seongnam-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 986 days.

(21) Appl. No.: 17/879,283

(22) Filed: Aug. 2, 2022

(65) Prior Publication Data

US 2023/0116956 A1 Apr. 20, 2023

(30) Foreign Application Priority Data

Oct. 15, 2021 (KR) ........................ 10-2021-0137051

(51) Int. Cl.
| | |
|---|---|
| *B23K 26/362* | (2014.01) |
| *B23K 26/06* | (2014.01) |
| *B23K 26/0622* | (2014.01) |
| *H10K 71/00* | (2023.01) |

(52) U.S. Cl.
CPC ........ *B23K 26/362* (2013.01); *B23K 26/0608* (2013.01); *B23K 26/0624* (2015.10); *H10K 71/00* (2023.02)

(58) Field of Classification Search
CPC .............. B23K 26/0006; B23K 26/042; B23K 26/0608; B23K 26/0622; B23K 26/0624;

B23K 26/082; B23K 26/0853; B23K 26/355; B23K 26/3584; B23K 26/362;
(Continued)

(56) References Cited

U.S. PATENT DOCUMENTS

| | | | |
|---|---|---|---|
| 9,112,099 | B2 | 8/2015 | Dunne |
| 9,377,681 | B2 | 6/2016 | Lee et al. |
| 9,656,291 | B2 | 5/2017 | Lee et al. |

(Continued)

FOREIGN PATENT DOCUMENTS

| | | |
|---|---|---|
| JP | 2008-41327 | 2/2008 |
| KR | 1020140099110 A | 8/2014 |

(Continued)

OTHER PUBLICATIONS

JP2008041327A—Machine Translation (Year: 2008).*
(Continued)

*Primary Examiner* — Yunju Kim
(74) *Attorney, Agent, or Firm* — CANTOR COLBURN LLP

(57) ABSTRACT

Provided is a mask manufacturing method including preparing a preliminary mask sheet including a first surface and a second surface facing each other, forming a mask support part including a concave part recessed from the first surface and a protrusion part adjacent to the concave part and protruding from the first surface by irradiating a first laser light to the first surface of the preliminary mask sheet, and forming an opening part adjacent to the protrusion part and penetrating the preliminary mask sheet by irradiating a second laser light on the second surface of the preliminary mask sheet.

20 Claims, 16 Drawing Sheets

(58) Field of Classification Search
CPC .... B23K 26/364; B23K 26/38; B23K 26/384;
B23K 26/402
See application file for complete search history.

(56) References Cited

U.S. PATENT DOCUMENTS

| | | | |
|---|---|---|---|
| 2015/0087103 A1* | 3/2015 | Dunne | .................. H10F 10/167 |
| | | | 438/68 |
| 2020/0058906 A1 | 2/2020 | Kim et al. | |
| 2021/0379694 A1* | 12/2021 | Jo | ......................... B23K 26/40 |

FOREIGN PATENT DOCUMENTS

| | | |
|---|---|---|
| KR | 10-2015-0034127 | 4/2015 |
| KR | 10-1918551 | 2/2019 |
| KR | 20200058906 | 2/2019 |
| KR | 10-2020-0021573 | 3/2020 |
| KR | 10-2134363 | 7/2020 |

OTHER PUBLICATIONS

Jorge Lehr et al., "Production of homogenous micro-structures by
femtosecond laser micro-matching", Optics and Lasers in Engineer-
ing, 2014, pp. 121-129.
Richard E. Russo, "Laser Ablation", Applied Spectroscopy, 1995,
pp. 14A-28A, vol. 49, No. 9.

* cited by examiner

| Stretch and fix preliminary mask sheet to mask frame | S110 |

↓

| Seat preliminary mask sheet on stage | S120 |

S300

| Irradiate first line | S310 |

↓

| Irradiate second line | S330-1 |

↓

| Irradiate second line | S330-2 |

⋮

| Irradiate second line | S330-m |

S330

MANUFACTURING METHOD FOR MASK

CROSS-REFERENCE TO RELATED APPLICATION(S)

This application claims priority to and benefits of Korean Patent Application No. 10-2021-0137051 under 35 U.S.C. § 119, filed on Oct. 15, 2021, in the Korean Intellectual Property Office, the entire contents of which are incorporated herein by reference.

BACKGROUND

1. Technical Field

The disclosure relates to a mask manufacturing method using a laser processing method.

2. Description of the Related Art

A display panel includes multiple pixels. Each of the pixels includes a driving element such as a transistor and a display element such as an organic light emitting element. The display element may be formed by stacking electrodes and various functional layers on a substrate.

The functional layers constituting the display element are patterned and provided using a mask with an open area that penetrates the mask. The shape of the patterned functional layers may be controlled according to the shape of the open area of the mask. Accordingly, in order to improve the deposition quality of the patterned functional layers, there is a need for developing technology for a mask processed with high precision in its open area and a method for manufacturing such a mask.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

The disclosure provides a method of manufacturing a mask for improving the deposition quality of functional layers formed on a target substrate.

An embodiment provides a mask manufacturing method that may include preparing a preliminary mask sheet including a first surface and a second surface facing each other, forming a mask support part including a concave part recessed from the first surface and a protrusion part adjacent to the concave part and protruding from the first surface by irradiating a first laser light to the first surface of the preliminary mask sheet, and forming an opening part adjacent to the protrusion part and penetrating the preliminary mask sheet by irradiating a second laser light on the second surface of the preliminary mask sheet.

In an embodiment, the first laser light may include pulse lasers sequentially provided in a first direction, the pulse lasers including a first pulse laser and a second pulse laser. In the forming of the mask support part, at least part of neighboring pulse lasers among the pulse lasers may overlap each other.

In an embodiment, a pulse overlap ratio of the at least part of neighboring pulse lasers may be about 80% or more. The pulse overlap ratio may be an overlap ratio of a first pulse width of the first pulse laser and a second pulse width of the second pulse laser. The first pulse width and the second pulse width may be diameters in a cross-section of the first pulse laser and the second pulse laser at an intensity of $I_{max}/e^2$, respectively. $I_{max}$ may be a maximum intensity of the first pulse laser and of the second pulse laser.

In an embodiment, a pulse overlap ratio of the at least part of neighboring pulse lasers may be about 80% or more. The pulse overlap ratio may be expressed in the following Equation 1.

$$\text{Pulse overlap ratio } (\%) = (1 - v/\text{ps} \times f) \times 100 \qquad \text{[Equation 1]}$$

In Equation 1, v is a scan speed of the first laser light, PS is a diameter in a cross section of a pulse laser among the pulse lasers at an intensity of $I_{max}/e^2$ of the first laser light, and f is a frequency of the first laser light. $I_{max}$ may be a maximum intensity of the pulse laser.

In an embodiment, the forming of the mask support part may include irradiating the first laser light to a first line along a virtual first line extending in a first direction, moving the preliminary mask sheet in a second direction different than the first direction, and irradiating the first laser light to a second line along a virtual second line extending in the first direction after the moving of the preliminary mask sheet.

In an embodiment, the moving of the preliminary mask sheet and the irradiating of the first laser to the second line may be repeated 9 or more times.

In an embodiment, the first laser light may include pulse lasers sequentially provided in the first direction, the pulse lasers including a first pulse laser and a second pulse laser. A line overlap ratio of a first line pulse laser in the irradiating of the first laser light to the first line and a second line pulse laser in the irradiating of the first laser light to the second line in which a position in the first direction overlaps is about 70% or more. The line overlap ratio may be an overlap ratio of a pulse width of the first line pulse laser in the second direction and a pulse width of the second line pulse laser in the second direction. The pulse width may be a diameter in a cross-section of the first line pulse laser and the second line pulse laser at an intensity of $I_{max}/e^2$, and $I_{max}$ is a maximum intensity of the first line pulse laser and of the second line pulse laser.

In an embodiment, the first laser light may include pulse lasers sequentially provided in the first direction, the pulse lasers including a first pulse laser and second pulse laser. A line overlap ratio of a first line pulse laser in the irradiating of the first laser light to the first line and a second line pulse laser in the irradiating of the first laser light to the second line in which a position in the first direction overlaps may be about 70% or more. The line overlap ratio may be represented by the following Equation 2.

$$\text{Line overlap ratio } (\%) = (1 - \Delta X/PS) \times 100 \qquad \text{[Equation 2]}$$

In Equation 2, $\Delta X$ is a movement distance of the preliminary mask sheet in the second direction, PS is a pulse width at an intensity of $I_{max}/e^2$ of the first laser light, and $I_{max}$ is a maximum intensity of the first line pulse laser and of the second line pulse laser.

In an embodiment, the first laser light and the second laser light may be pulse lasers having a pulse width in a range of femtoseconds ($10^{-15}$) to picoseconds ($10^{-12}$), respectively.

In an embodiment, a wavelength of the first laser light may be in a range of about 400 nm to about 600 nm.

In an embodiment, a frequency of the first laser light may be in a range of about 10 kHz to about 1000 kHz.

In an embodiment, a beam size of the first laser light may be in a range of about 10 m to about 100 μm.

In an embodiment, an intensity of the first laser light may be about 1.25 GW/m² or more.

In an embodiment, the opening part may have a rectangular shape in a plan view. The protrusion part may be formed side by side along a side of the opening part.

In an embodiment, in a plan view, the protrusion part may be formed to form a closed curve surrounding the opening part at an outside of the opening part.

In an embodiment, a mask manufacturing method using a laser processing device may include providing a preliminary mask sheet including first and second surfaces facing each other on a stage, forming a mask support part including a concave part recessed from the first surface and a protrusion part adjacent to the concave part and protruding from the first surface by irradiating a first laser light to the first surface of the preliminary mask sheet while moving the stage in a first direction; and forming an opening part adjacent to the protrusion part and penetrating the preliminary mask sheet by irradiating a second laser light to the second surface of the preliminary mask sheet. The laser processing device may include a support part including the stage that is movable in each of a first direction and a second direction orthogonal to the first direction, and a laser light providing part disposed on the support part.

In an embodiment, the providing of the preliminary mask sheet may include tensioning and fixing the preliminary mask sheet to a mask frame; and seating the preliminary mask sheet on the stage so that the first surface of the preliminary mask sheet fixed to the mask frame is adjacent to the laser light providing part.

In an embodiment, the forming of the mask support part may include repeatedly irradiating the first laser light in the first direction parallel to a side of a preliminary open area of the preliminary mask sheet formed of the opening part.

In an embodiment, the first laser light may have an intensity of about 1.25 GW/m² or more, and include pulse lasers sequentially provided in a first direction, the pulse lasers including a first pulse laser and a second pulse laser. The forming of the mask support part may include irradiating the first laser light to a first line along a virtual first line extending in the first direction, moving the preliminary mask sheet in the second direction, and irradiating the first laser light to a second line along a virtual second line extending in the first direction after the moving of the preliminary mask sheet. A pulse overlap ratio of the at least part of neighboring pulse lasers among the pulse lasers may be about 80% or more. The pulse overlap ratio may be expressed in the following Equation 1.

$$\text{Pulse overlap ratio (\%)} = \left(1 - v/\text{ps} \times f\right) \times 100 \qquad \text{[Equation 1]}$$

In Equation 1, v is a scan speed of the first laser light, PS is a pulse width at an intensity of $I_{max}/e^2$ of the first laser light, f is a frequency of the first laser light, and $I_{max}$ is a maximum intensity of the first pulse laser and of the second pulse laser.

In an embodiment, a line overlap ratio of a first line pulse laser in the irradiating of the first laser light to the first line and a second line pulse laser in the irradiating of the first laser light to the second line in which a position in the first direction overlaps may be about 70% or more. The line overlap ratio may be expressed in Equation 2 below.

$$\text{Line overlap ratio (\%)} = \left(1 - \Delta X/PS\right) \times 100 \qquad \text{[Equation 2]}$$

In Equation 2, $\Delta X$ is a movement distance of the preliminary mask sheet in the second direction, and PS is a pulse width at an intensity of $I_{max}/e^2$ of the first laser light.

BRIEF DESCRIPTION OF THE DRAWINGS

The accompanying drawings are included to provide a further understanding of the embodiments, and are incorporated in and constitute a part of this specification. The drawings illustrate embodiments and together with the description, serve to explain principles of the embodiments. The above and other aspects and features of the disclosure will become more apparent by describing in detail embodiments thereof with reference to the attached drawings, in which:

FIG. 1 is a schematic plan view of a display device according to an embodiment;

FIG. 5 is a schematic cross-sectional view of a portion of a mask according to an embodiment;

DETAILED DESCRIPTION OF THE EMBODIMENTS

Figure 2:
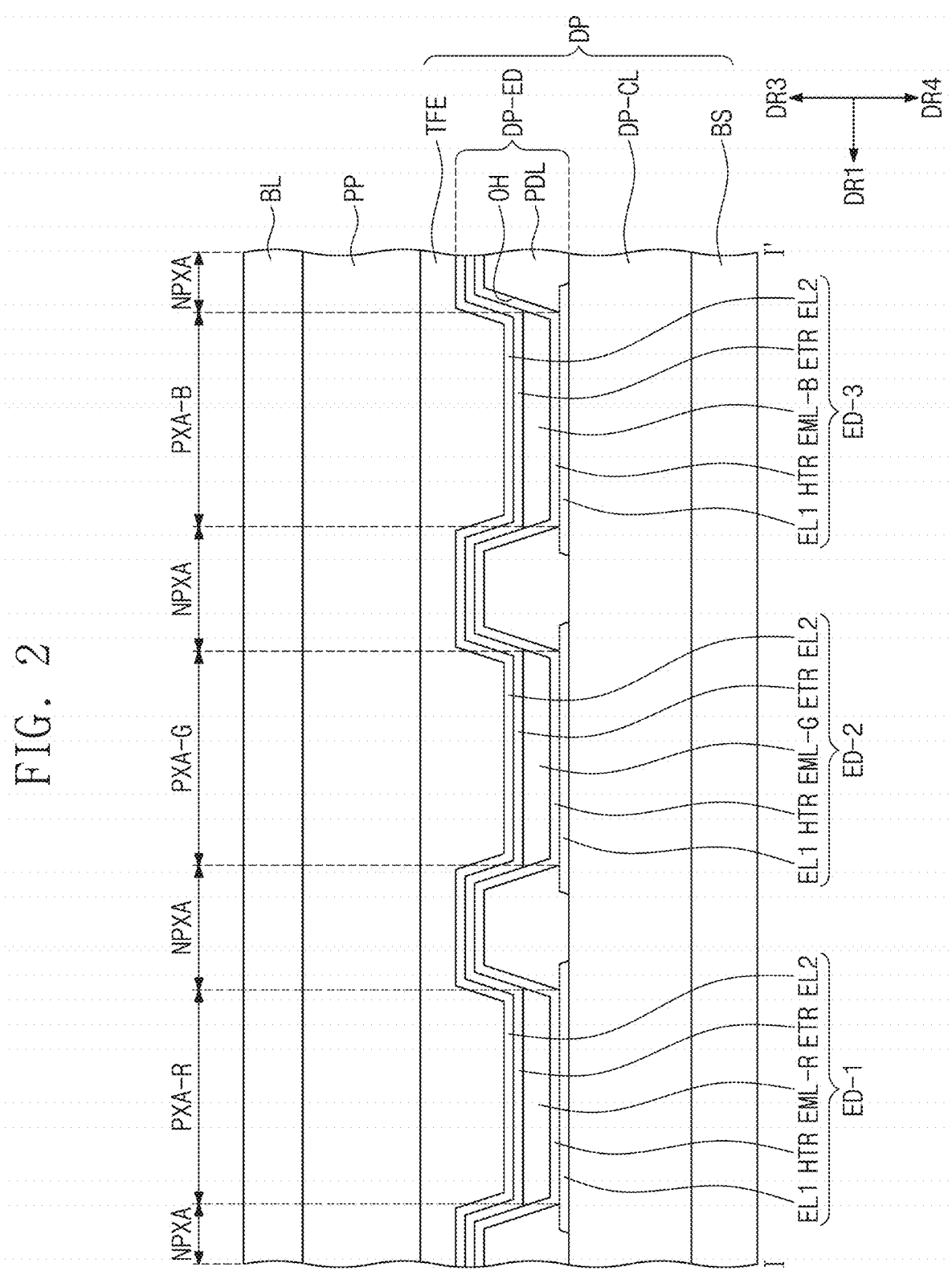
FIG. 2 is a schematic cross-sectional view of a portion of a display device according to an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In this specification, when an element (or region, layer, part, etc.) is referred to as being "on", "connected to", or "coupled to" another element, the element may be directly placed on/connected to/coupled to other components, or a third component may be arranged between them.

In the specification, "directly disposed" may mean that there is no layer, film, region, plate, and the like added between a portion such as a layer, film, region, or plate and another portion. For example, "directly disposed" may mean disposing between two layers or two members without using an additional member such as an adhesive member.

Like reference numerals refer to like elements. In the drawings, the thicknesses, proportions, and dimensions of components are exaggerated for effective description.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

In the specification and the claims, "and/or" includes all of one or more combinations defined by related components. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

"About," "substantially," or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within 30%, 20%, 10%, 5% of the stated value.

It will be understood that the terms "first" and "second" are used herein to describe various components, but these components should not be limited by these terms. The above terms are used only to distinguish one component from another. For example, a first component may be referred to as a second component and vice versa without departing from the scope of the disclosure. The terms of a singular form may include plural forms unless otherwise specified.

Terms such as "below", "the lower side", "on", and "the upper side" are used to describe a relationship of configurations shown in the drawing. The terms are described as a relative concept based on a direction shown in the drawing. In the specification, "disposed on" may refer to a case of being disposed not only on the upper part of any one member but also on the lower part.

Unless otherwise defined, all terms (including technical and scientific terms) used herein have the same meaning as commonly understood by one of ordinary skill in the art to which this disclosure belongs. It will further be understood that terms, such as those defined in commonly used dictionaries should be interpreted as having a meaning consistent with the meaning in the context of the related technology, and it should not be construed in an overly ideal or overly formal sense unless explicitly defined here.

In the disclosure, the term "include," "comprise," "including," or "comprising," specifies a property, a region, a fixed number, a step, a process, an element and/or a component but does not exclude other properties, regions, fixed numbers, steps, processes, elements and/or components.

Hereinafter, a mask manufacturing method according to an embodiment will be described with reference to the drawings.

Figure 1:
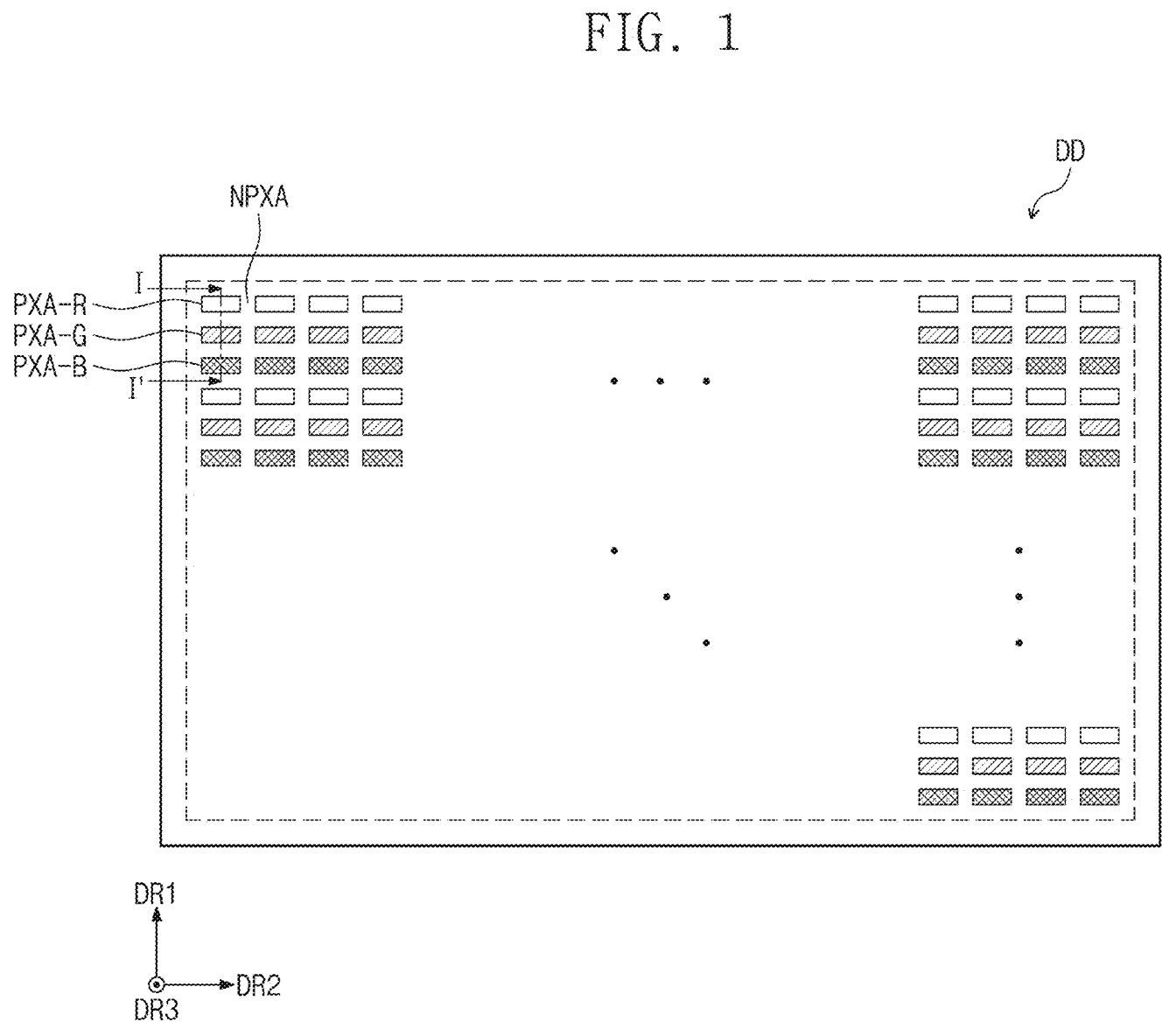

FIG. 1 is a schematic plan view illustrating an embodiment of a display device. FIG. 2 is a schematic cross-sectional view of a display device according to an embodiment. FIG. 2 may be a schematic cross-sectional view corresponding to a line I-I' of FIG. 1.

The display device DD illustrated in FIGS. 1 and 2 may include emission areas PXA-R, PXA-G, and PXA-B. The display device DD may include a first emission area PXA-R, a second emission area PXA-G, and a third emission area PXA-B that are separated from each other. For example, the first emission area PXA-R may be a red emission area emitting red light, the second emission area PXA-G may be a green emission area emitting green light, and the third emission area PXA-B may be a blue emission area emitting blue light. The first to third emission areas PXA-R, PXA-G, and PXA-B are divided without overlapping each other in a plan view defined by the first direction axis DR1 and the second direction axis DR2, and a non-emission area NPXA may be disposed between the neighboring emission areas PXA-R, PXA-G, and PXA-B.

An embodiment of the display device illustrated in FIGS. 1 and 2 may include at least one functional layer provided using a mask manufactured by the method of manufacturing a mask according to an embodiment to be described below. For example, among the functional layers included in the display device shown in FIGS. 1 and 2, a functional layer in the form of a common layer provided to overlap all of the emission areas PXA-R, PXA-G, and PXA-B may be provided using a mask manufactured by a method according to an embodiment to be described below.

In FIG. 1 and the following drawings, the first direction axis DR1 to the fourth direction axis DR4 are shown, and the directions indicated by the first to fourth direction axes DR1, DR2, DR3, and DR4 described herein are relative concepts and may be converted into other directions. Directions indicated by the first to fourth direction axes DR1, DR2, DR3, and DR4 may be described as the first to fourth directions, and the same reference numerals may be used. In the specification, the first direction axis DR1 and the second direction axis DR2 are orthogonal to each other, and the third direction axis DR3 and the fourth direction axis DR4 may be in a direction normal to a plane defined by the first direction axis DR1 and the second direction axis DR2. The direction of the fourth direction axis DR4 may be defined as a direction opposite to the direction of the third direction axis DR3.

In the display device DD illustrated in FIG. 1, the emission areas PXA-R, PXA-G, and PXA-B are arranged in a stripe shape. For example, in the display device DD shown in FIG. 1, first emission areas PXA-R, second emission areas PXA-G, and third emission areas PXA-B may be aligned along the second direction axis DR2. The first emission area PXA-R, the second emission area PXA-G, and the third emission area PXA-B may be alternately arranged in the order along the first direction axis DR1.

The arrangement of the emission areas PXA-R, PXA-G, and PXA-B is not limited to that shown in FIG. 1, and the order in which the first emission area PXA-R, the second emission area PXA-G, and the third emission area PXA-B are arranged may be provided in various combinations according to characteristics of display quality required by the display device DD.

For example, the arrangement of the emission areas PXA-R, PXA-G, and PXA-B may be a PENTILE™ arrangement or a diamond-shaped arrangement. The area and planar shape of the emission areas PXA-R, PXA-G, and PXA-B may be adjusted or modified according to characteristics of display quality required for the display device DD.

The functional layer provided as a common layer to overlap the entire the emission areas PXA-R, PXA-G, and PXA-B having these various types of arrangement and the non-emission area NPXA disposed between the emission areas PXA-R, PXA-G, and PXA-B may be provided using a mask manufactured by a method according to an embodiment to be described below.

Referring to FIG. 2, the display device DD may include a display panel DP and an optical layer PP disposed on the display panel DP. The display panel DP may include light emitting elements ED-1, ED-2, and ED-3. The optical layer PP may be disposed on the display panel DP to control light reflected from the display panel DP by external light. The optical layer PP may include, for example, a polarizing layer or a color filter layer. In other examples, the optical layer PP may be omitted in the display device DD according to an embodiment.

A base layer BL may be disposed on the optical layer PP. The base layer BL may be a member that provides a base surface on which the optical layer PP is disposed. The base layer BL may be an inorganic layer, an organic layer, or a composite material layer. In other examples, the base layer BL may be omitted.

In an embodiment, the display panel DP may include a base substrate BS, a circuit layer DP-CL provided on the base substrate BS, and a display element layer DP-ED. The display panel DP may also include an encapsulation layer TFE disposed on the display element layer DP-ED.

In the display device DD according to an embodiment, the display panel DP may be an organic electroluminescence display panel including an organic electroluminescence element in the display element layer DP-ED. The mask according to an embodiment to be described later may be used when forming a part of a functional layer of the display element layer DP-ED of an organic electroluminescence display panel.

In an embodiment, the circuit layer DP-CL may be disposed on the base substrate BS, and the circuit layer DP-CL may include transistors (not shown). Each of the transistors (not shown) may include a control electrode, an input electrode, and an output electrode. The circuit layer DP-CL may include insulating layers.

The encapsulation layer TFE may cover the light emitting elements ED-1, ED-2, and ED-3. The encapsulation layer TFE may encapsulate the display element layer DP-ED. The encapsulation layer TFE may be a thin film encapsulation layer.

Each of the light emitting elements ED-1, ED-2, and ED-3 may include a first electrode EL1, a hole transport region HTR, light emitting layers EML-R, EML-G, and EML-B, an electron transport region ETR, and a second electrode EL2. In FIG. 2, the light emitting layers EML-R, EML-G, and EML-B of the light emitting elements ED-1, ED-2, and ED-3 maybe disposed in the opening part OH defined in the pixel defining layer PDL, and the hole transport region HTR, the electron transport region ETR, and the second electrode EL2 may be provided as a common layer in all of the light emitting elements ED-1, ED-2, and ED-3. At least one of the hole transport region HTR, the electron transport region ETR, and the second electrode EL2 provided as the common layer in the light emitting elements ED-1, ED-2, and ED-3 of the display device DD may be provided using a mask manufactured by the method according to an embodiment to be described below.

Some of the insulating layers included in the circuit layer DP-CL or the encapsulation layer TFE disposed on the light emitting elements ED-1, ED-2, and ED-3 may be provided using a mask manufactured by the method of manufacturing a mask according to an embodiment described below, which may also be referred to as an open mask.

Figure 3:
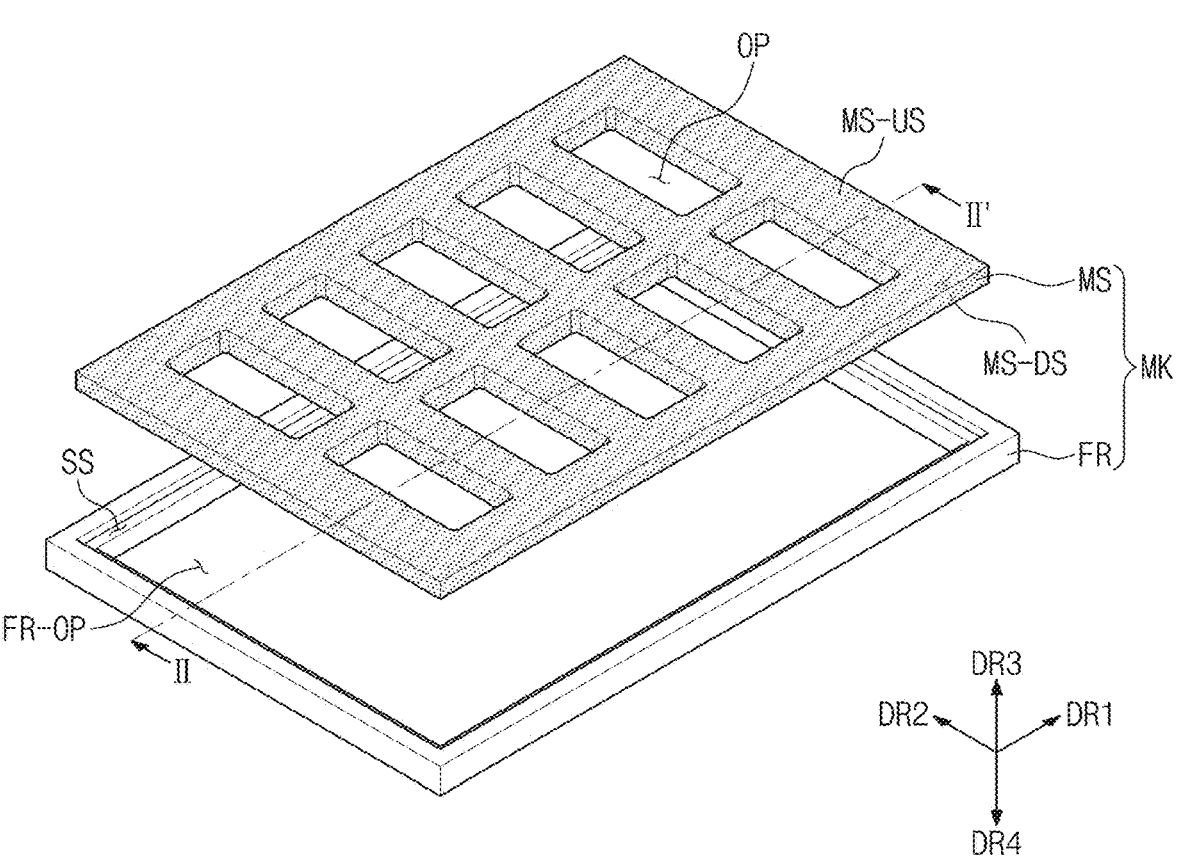
FIG. 3 is an exploded schematic perspective view of a mask according to an embodiment.
Figure 4:
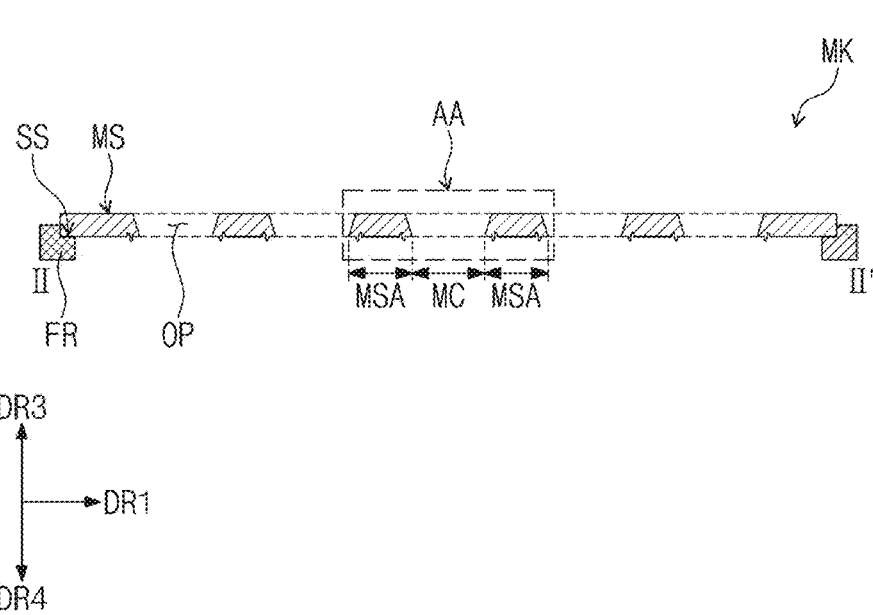
FIG. 4 is a schematic cross-sectional view of a mask of an embodiment.
Figure 5:
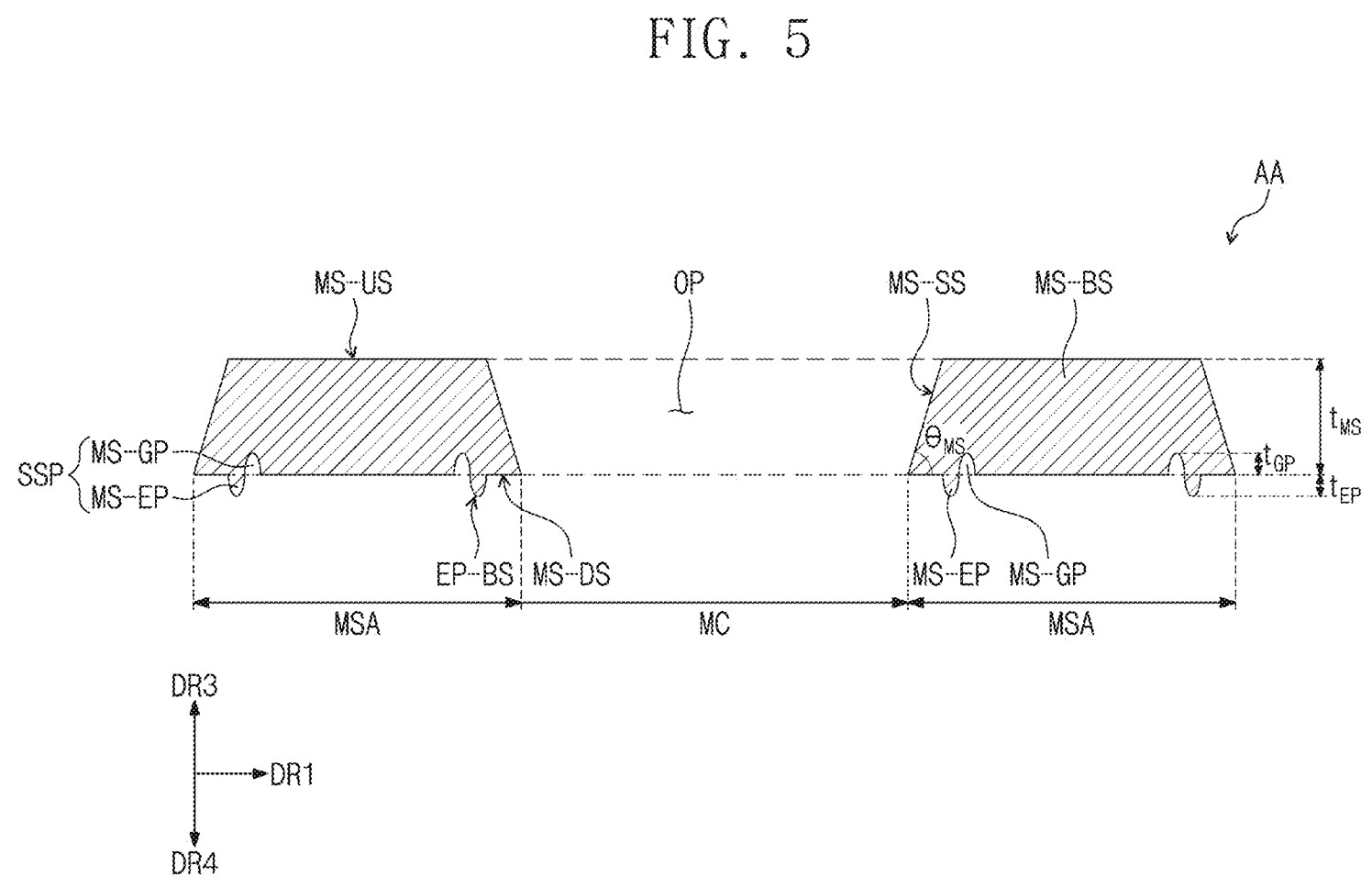

FIGS. 3 to 5 are schematic views showing a mask according to an embodiment manufactured by the method for manufacturing a mask according to an embodiment to be described below. FIG. 3 is an exploded schematic perspective view illustrating a mask according to an embodiment. FIG. 4 is a schematic cross-sectional view of a mask according to an embodiment, and FIG. 5 is a schematic cross-sectional view illustrating a part of the mask according to an embodiment. FIG. 4 is a cross-sectional view corresponding to a line II-II' of FIG. 3, and FIG. 5 is a schematic cross-sectional view illustrating area AA of FIG. 4.

The mask MK of the embodiment described with reference to FIGS. 3 to 5 may include a mask support part SSP formed by the method of manufacturing a mask according to an embodiment including repeatedly irradiating laser light so that the pulse lasers at least partially overlap each other Referring to FIGS. 3 to 5, the mask MK according to an embodiment may include a mask sheet MS and a mask frame FR. The mask MK according to an embodiment may be used to form a common layer including the same material on a target substrate, which is a deposition surface. The mask MK according to an embodiment may correspond to an open mask for a thin film process used to form a functional layer provided as a thin film. The open mask for the thin film process may be a mask used to stack a thin film layer of the same material on the entire display device on a target substrate.

The mask frame FR may support the mask sheet MS. For example, a frame opening FR-OP may be defined inside the mask frame FR, and a mask sheet MS may be disposed in the frame opening FR-OP.

The mask frame FR may support an edge portion of the mask sheet MS. In an embodiment, the mask frame FR may be disposed under the mask sheet MS. The mask sheet MS may be seated on the mask frame FR. For example, the mask frame FR includes a support surface SS for supporting the mask sheet MS on the inside in which the frame opening FR-OP is defined, and the mask sheet MS may be disposed on the support surface SS. However, the embodiment is not limited thereto, and the mask frame FR may be disposed above and below the edge of the mask sheet MS to support the mask sheet MS.

The mask sheet MS may be fixed to the mask frame FR. The mask sheet MS may be fixed to the mask frame FR by being welded to the mask frame FR.

The mask frame FR may be formed of a metal material including at least one of iron (Fe) and nickel (Ni). For example, the mask frame FR may include an alloy of iron and nickel. The mask frame FR may be manufactured from stainless steel (SUS) or Invar.

The mask sheet MS may include at least one open area MC. In an embodiment, the mask sheet MS may include open areas MC spaced apart from each other when viewed in a plan view.

The open areas MC may be aligned and defined on a plane defined by the first direction axis DR1 and the second direction axis DR2. FIG. 3 shows an embodiment of the mask sheet MS in which five open areas MC are defined to be spaced apart from each other along the first direction axis DR1 and two open areas MC are defined to be spaced apart from each other along the second direction axis DR2. However, this is an example, and the number of open areas MC is not limited to those illustrated. The open areas MC may be arranged to have regular intervals along any one of the first directional axis DR1 and the second directional axis DR2. A material forming a functional layer in the form of a common layer may be deposited on the target substrate through each of the open areas MC. The manufacturing operation of forming the open areas MC may include forming an opening part penetrating an upper surface and a lower surface by irradiating a laser light in a method of manufacturing a mask according to an embodiment to be described below.

The mask sheet MS may be formed of a metal material including at least one of iron (Fe) and nickel (Ni). For example, the mask sheet MS may include an alloy of Fe and Ni. The mask sheet MS may be manufactured form stainless steel (SUS) or Invar. The mask sheet MS may be formed of the same material as the mask frame FR. However, the embodiment is not limited thereto.

The mask sheet MS may have a thermal expansion coefficient of about 5 ppm/° C. or less. The mask frame FR may also have a coefficient of thermal expansion similar to that of the mask sheet MS. Accordingly, by minimizing thermal deformation of the mask sheet MS in the deposition process, it is possible to improve the deposition quality on the target substrate.

The mask sheet MS according to an embodiment may have a plate shape extending along the first and second directional axes DR1 and DR2. In an embodiment, the mask sheet MS may have a rectangular shape defined by the first direction axis DR1 and the second direction axis DR2 in a plan view. However, the embodiment is not limited thereto, and the shape of the mask sheet MS may be provided in a different shape depending on the shape of the target substrate, which is the deposition surface, or the shape of the mask frame FR supporting the mask sheet MS.

The open areas MC in the mask sheet MS according to an embodiment may have a rectangular shape in a plan view. However, the embodiment is not limited thereto, and the shape of the open areas MC may be changed according to the shape of the functional layers which are formed by deposition on the target substrate. The mask sheet MS includes a lower surface MS-DS (or a first surface) and an upper surface MS-US (or a second surface) facing each other, and an opening part OP penetrating between the upper surface MS-US and the lower surface MS-DS may be defined in the mask sheet MS. An open area MC may be defined in the mask sheet MS by the opening part OP penetrating from the upper surface MS-US to the lower surface MS-DS.

In the mask MK according to an embodiment, the mask sheet MS may include an open area MC and a masking area MSA. The open area MC may be defined as an area between the masking areas MSA. The open area MC may be an area corresponding to an area on a plane of a common layer type functional layer included in a display device DD (refer to FIG. 1). In the mask MK according to an embodiment, the open area MC may correspond to a deposition area of a target substrate to which a deposition material is provided. A deposition material may be provided on the target substrate according to the shape of the open area MC.

In the specification, the width of the open area MC may be defined as the width of the opening area in the opening part OP adjacent to the target substrate to which the deposition material is provided. For example, in the embodiment illustrated in FIGS. 3 and 4, the open area MC may be an open area adjacent to the lower surface MS-DS of the mask sheet MS.

In the mask MK of the embodiment, the mask sheet MS may include a mask support part SSP disposed on the lower surface MS-DS. The mask support part SSP may maintain a gap of a regular interval between the mask MK and the deposition surface of the target substrate. The mask support part SSP may prevent denting of on the target substrate, which is the deposition surface. In the mask manufacturing method of an embodiment to be described below, the mask support part SSP may be formed by repeatedly irradiating the first laser light onto the first surface of the preliminary mask sheet. The mask support part SSP may be formed by causing a deformation on a surface of the preliminary mask sheet by repeatedly irradiating the first laser light so that the peaks of the laser light overlap.

In the mask sheet MS according to an embodiment, the mask support part SSP may include a protrusion part MS-EP protruding from the lower surface MS-DS and a concave part MS-GP recessed from the lower surface MS-DS. The mask sheet MS of an embodiment may include a base part MS-BS with the upper surface MS-US and the lower surface MS-DS facing each other and uniformly spaced apart from each other, a protrusion part MS-EP that is disposed on the lower surface MS-DS of the base part MS-BS and that protrudes, and a concave part MS-GP that is concavely recessed in the direction from the lower surface MS-DS to the upper surface MS-US. The open areas MC of the mask sheet MS may be defined in the base part MS-BS.

The protrusion part MS-EP may be disposed on the lower surface MS-DS of the mask sheet MS and may protrude in the fourth direction axis DR4 direction, which is a direction spaced apart from the lower surface MS-DS. The concave part MS-GP may be recessed from the lower surface MS-DS of the mask sheet MS and be concave in the third direction axis DR3 direction, towards the upper surface MS-US direction.

The protrusion part MS-EP may be disposed adjacent to the opening part OP. The protrusion part MS-EP may be adjacent to the open area MC defined by the opening part OP. The protrusion part MS-EP may be disposed on both sides of an open area MC, respectively. However, the embodiment is not limited thereto, and one protrusion part MS-EP may be provided between adjacent open areas MC, or three or more protrusion parts may be provided. In the deposition process using the mask MK according to an embodiment, the protrusion part MS-EP may be adjacent to a target substrate serving as a deposition surface, and the base part MS-BS may be disposed apart from the target substrate. The protrusion part MS-EP may contact the target substrate, and the base part MS-BS may be disposed to be spaced apart from the target substrate by the thickness of the protrusion part MS-EP.

In an embodiment, the thickness $t_{EP}$ of the protrusion part MS-EP may be about 0.1 μm or more and about 10 μm or less. For example, the thickness $t_{EP}$ of the protrusion part MS-EP may be about 1 μm or more and about 10 μm or less. When the thickness $t_{EP}$ of the protrusion part MS-EP is less than about 0.1 μm, since the target substrate is not sufficiently separated from the mask sheet MS, the target substrate may be dented by the mask sheet MS during the deposition process. When the thickness $t_{EP}$ of the protrusion part MS-EP exceeds about 10 μm, the separation distance between the target substrate and the open area MC may increase. Because of this increased separation distance, a wide shadow region in which the deposition material is not sufficiently provided may appear in the deposition region. Accordingly, when the thickness $t_{EP}$ of the protrusion part MS-EP is about 0.1 μm or more and about 10 μm or less, damage to the surface of the target substrate may be avoided and a thin film meeting the specified deposition quality may be formed.

In the case of the mask manufacturing method of an embodiment, a protrusion part MS-EP maintained with a thin thickness of about 10 μm or less may be formed by inducing deformation of a surface of the mask sheet using the overlapping pulse laser. Accordingly, the deposition quality of the thin film manufactured using the mask according to the embodiment may be improved.

In an embodiment, the thickness $t_{MS}$ of the base part MS-BS of the mask sheet MS may be about 20 μm or more and about 200 μm or less. The thickness $t_{MS}$ of the base part MS-BS may correspond to a gap between the upper surface MS-US and the lower surface MS-DS of the mask sheet MS. The mask sheet MS of an embodiment includes a protrusion part MS-EP having a relatively thin thickness compared to the base part MS-BS, so that it is possible to improve the quality of the deposition surface edge while protecting the surface of the target substrate. The deposition surface edge may correspond to a boundary between the deposition region and the non-deposition region. The quality of the deposition surface edge may be improved as the area of the shadow region on the deposition surface edge becomes smaller.

In the mask sheet MS of the embodiment, the bottom surface EP-BS of the protrusion part may have a convex curved surface in a direction spaced apart from the bottom surface MS-DS of the mask sheet MS. In FIG. 5, the protrusion part MS-EP is shown as having a protrusion part bottom surface EP-BS of one protrusion shape, but an embodiment is not limited thereto, and the protrusion part MS-EP of various shapes may be provided in a range in which the maximum thickness $t_{EP}$ of the protrusion part MS-EP is maintained at about 10 μm or less.

The mask sheet MS of an embodiment includes a concave part MS-GP defined on the lower surface MS-DS. Concave parts MS-GP may be disposed on the lower surface MS-DS of the mask sheet MS according to an embodiment. The concave part MS-GP may be disposed adjacent to the protrusion part MS-EP. A protrusion part MS-EP may be placed adjacent to the opening part OP of the mask sheet MS, and a concave part MS-GP may be arranged adjacent to the protrusion part MS-EP and spaced apart from the opening part OP.

In the mask sheet MS of an embodiment, a side of the concave part MS-GP of the mask support part SSP may be connected to a side of the neighboring protrusion part MS-EP. According to the mask manufacturing method according to an embodiment, the concave part MS-GP and the protrusion part MS-EP may be formed in the same process. The concave part MS-GP of the mask sheet MS according to an embodiment may be formed by irradiating a laser light to the first surface of the preliminary mask sheet in the mask manufacturing method of the embodiment, and the protrusion part MS-EP may be formed by being connected to the concave part MS-GP by deforming the area of the mask sheet surface adjacent to the concave part MS-GP through the repeated irradiation of laser light.

The concave part MS-GP may have a shape that is vertically symmetrical with the protrusion part MS-EP based on the lower surface MS-DS of the mask sheet MS. However, the embodiment is not limited thereto, and the shape of the concave part MS-GP may be amorphous, or the shape of the concave parts MS-GP may be random.

The thickness $t_{GP}$ of the concave part MS-GP may be about 0.1 μm or more and about 10 μm or less. The thickness $t_{GP}$ of the concave part MS-GP may be similar to the thickness $t_{EP}$ of the neighboring protrusion part MS-EP. However, the embodiment is not limited thereto.

In the mask sheet MS of an embodiment, the volume of the protrusion part MS-EP protruding from the lower surface MS-DS of the mask sheet MS and the volume of the adjacent concave part MS-GP may be similar. The protrusion part MS-EP and the concave part MS-GP simultaneously formed in a single process operation of repeatedly irradiating the first laser light according to the mask manufacturing method of an embodiment to be described below may have similar volumes. The volume of the protrusion part MS-EP that protrudes from the lower surface MS-DS of the mask sheet MS and the concave part MS-GP that sinks into the lower surface MS-DS of the mask sheet MS may have similar volumes. However, the embodiment is not limited thereto, and the volume of the protrusion part MS-EP may be larger than the volume of the adjacent concave part MS-GP.

Referring to FIG. 5, the opening part OP defined in the mask sheet MS may have a trapezoidal shape in cross section. On the cross section defined by the first directional axis DR1 and the third directional axis DR3, the opening part OP may have a trapezoidal shape in which the width decreases from the upper surface MS-US to the lower surface MS-DS direction of the mask sheet MS.

The opening part OP of the mask sheet MS may be formed by using the second laser light according to the mask manufacturing method according to an embodiment. By forming the opening part OP using the second laser light, it is possible to increase the processing precision of the opening side surface MS-SS of the mask sheet MS defining the opening part OP. The shape and size of the opening part OP manufactured by using the laser light may precisely match the shape and size of the design of the opening parts OP, thereby exhibiting high numerical precision. In an embodiment, a mask in which the opening part OP match the required shape and size of the opening parts may be provided by using a laser light.

In the mask sheet MS of an embodiment, the precision of the arrangement form of the opening parts OP, the numerical precision of the masking area MSA defined between the opening parts OP, and the like may also meet required levels.

The opening side surface MS-SS of the mask sheet MS defining the opening part OP may be inclined with respect to the lower surface MS-DS of the mask sheet MS. The inclination angle $\theta_{MS}$ of the opening side surface MS-SS of the mask sheet MS with respect to the lower surface MS-DS of the mask sheet MS may be about 30 degrees or more and about 70 degrees or less. For example, the inclination angle $\theta_{MS}$ may be about 30 degrees to about 50 degrees. In an embodiment, as increasing the ratio of the area of the deposition region to the size of the mask sheet by setting the inclination angle $\theta_{MS}$ of the opening side surface MS-SS to about 30 degrees or more and about 70 degrees or less, the formation of shadow regions in the deposition region may be minimized.

The opening side surface MS-SS of the mask sheet MS defining the opening part OP may have traces of processing by laser light when the opening part OP is formed using a laser. For example, the processing trace may appear as wavy patterns on the opening side surface MS-SS. However, the shape of the traces due to laser processing is not limited thereto, and compared to the processing the opening part by the wet-etching method, the traces from the laser light may be observable.

An oxide layer may be formed on the opening side surface MS-SS of the mask sheet MS exposed in the opening part OP. An oxide layer of a metal material constituting the mask sheet MS may be formed on the opening side surface MS-SS. Compared to processing the opening part by wet-etching, the mask sheet MS according to an embodiment may further include an oxide layer in the exposed portion.

The shape of the protrusion part MS-EP illustrated in FIG. 5 and the like are examples and the embodiments are not limited to the shape of the protrusion part MS-EP. In an embodiment, the protrusion part MS-EP has a protrusion shape maintained at a selected thickness, and the protrusion part MS-EP may be provided in various forms according to the degree of processing of the mask sheet.

Figure 6A:
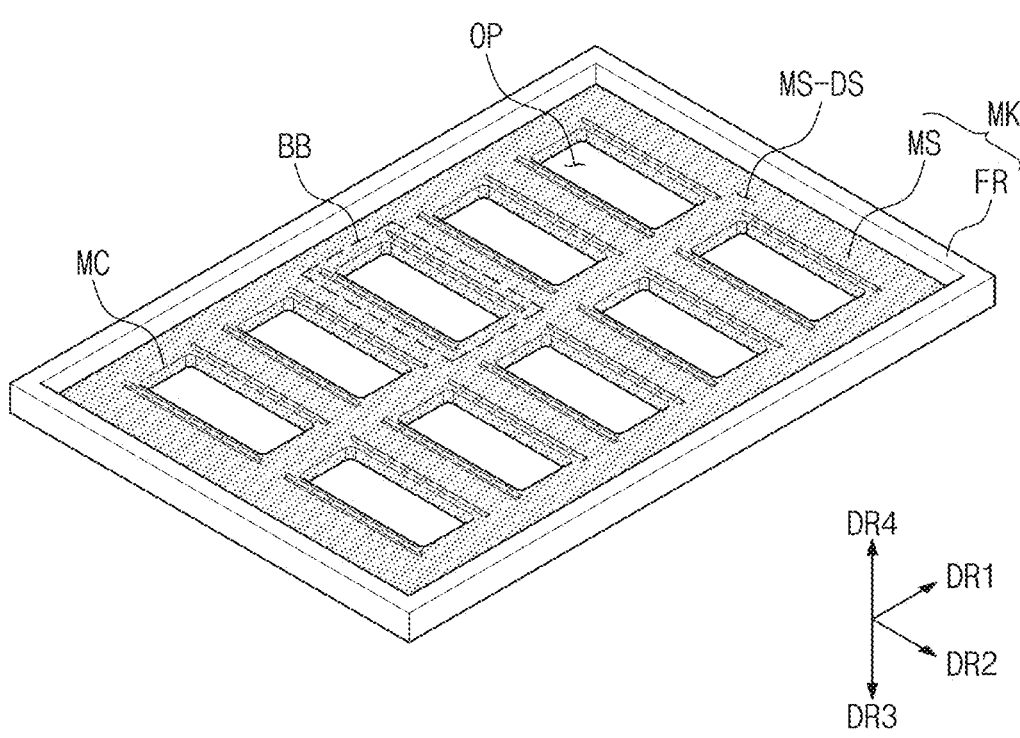
FIG. 6A is a schematic perspective view of a mask of an embodiment.
Figure 6B:
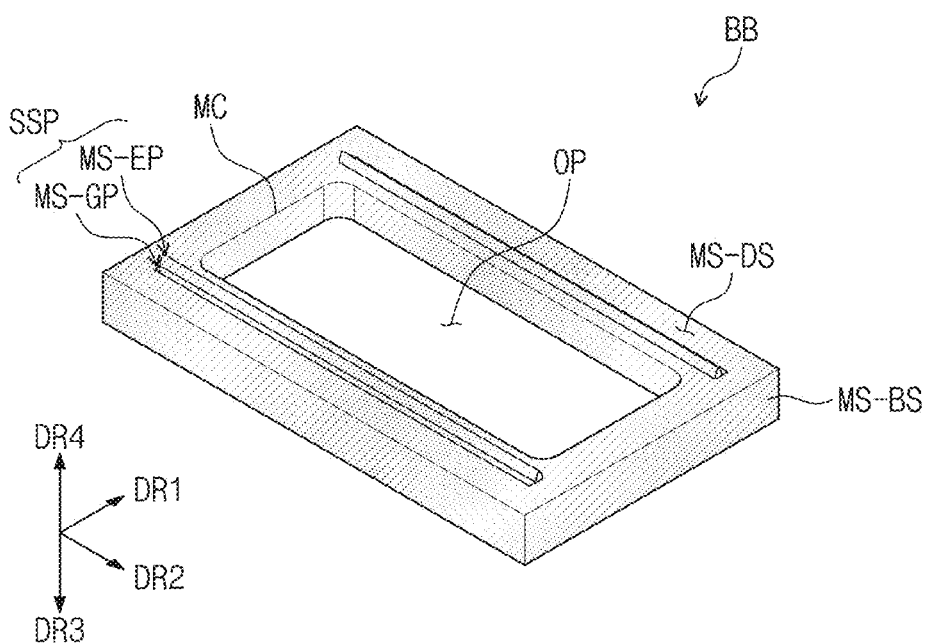
FIG. 6B is a schematic perspective view of a portion of a mask in an embodiment.
Figure 6C:
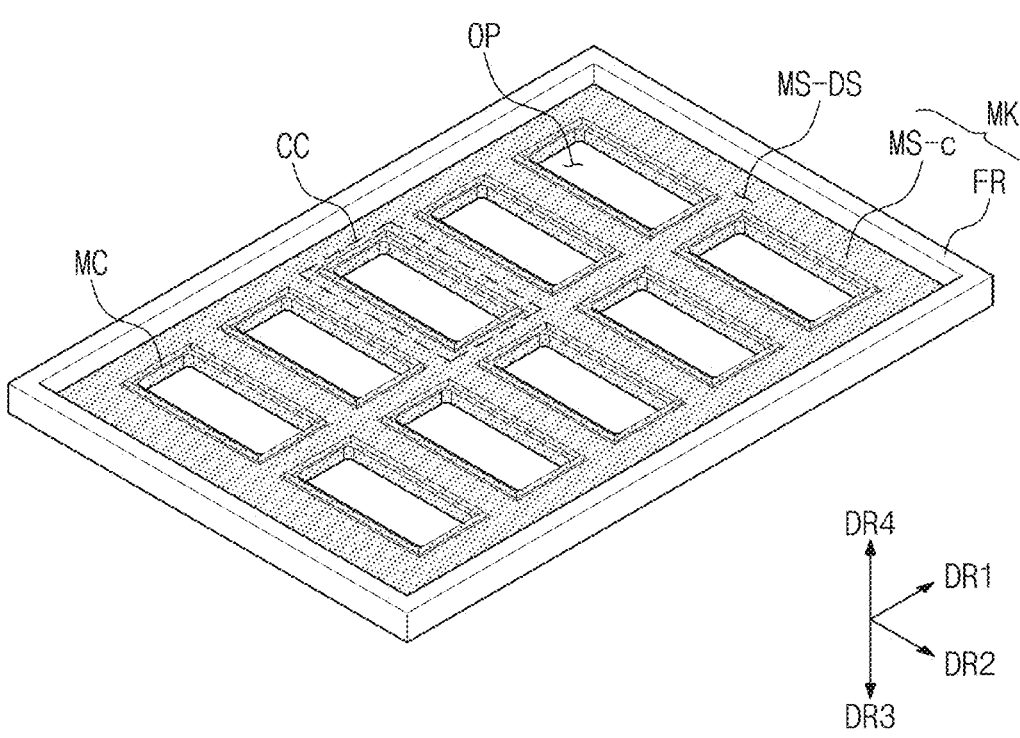
FIG. 6C is a schematic perspective view of a mask in an embodiment.
Figure 6D:
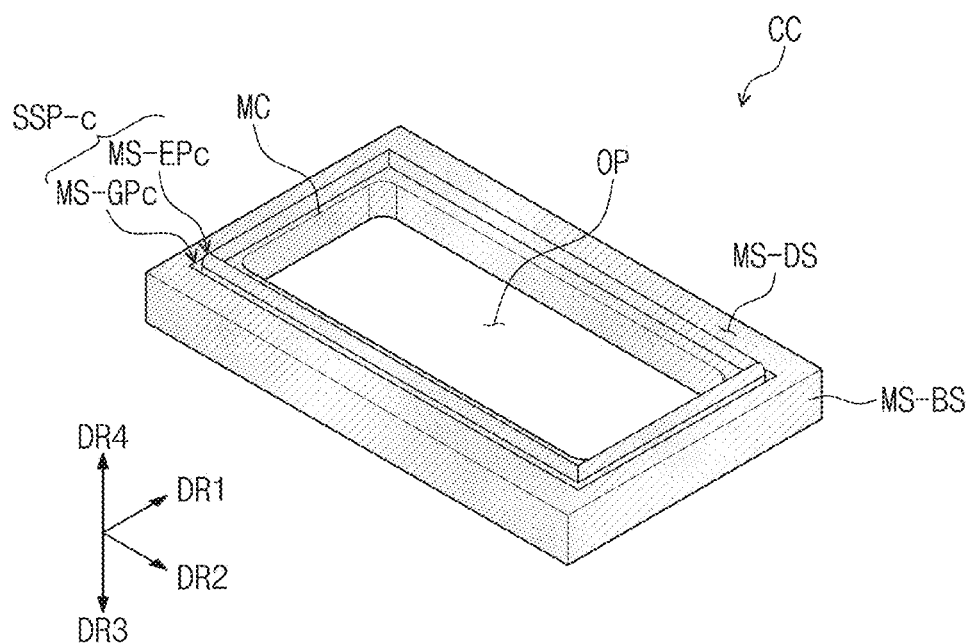
FIG. 6D is a schematic perspective view of a portion of a mask in an embodiment.

FIG. 6A is a schematic perspective view of a mask according to an embodiment, and FIG. 6B is a schematic perspective view illustrating a portion of the mask according to an embodiment. FIG. 6C is also a schematic perspective view of a mask according to an embodiment, and FIG. 6D is a perspective view illustrating a portion of the mask according to an embodiment. FIG. 6B shows a portion corresponding to region BB of FIG. 6A. FIG. 6D shows a portion corresponding to region CC of FIG. 6C. In FIGS. 6A to 6D, the lower surfaces MS-DS of the mask sheets MS and MS-c are shown facing upward.

Referring to FIGS. 6A and 6B, in the mask MK according to an embodiment, open areas MC may be defined in the mask sheet MS. The open areas MC may be arranged to be spaced apart from each other on a plane defined by the first directional axis DR1 and the second directional axis DR2.

Each of the open areas MC may have a rectangular shape on a plane. In an embodiment, each of the protrusion parts MS-EP and the concave parts MS-GP adjacent to the open areas MC may have a stripe shape parallel to one side of the open areas MC on a plane. The mask support part SSP may be formed and disposed on at least one side of each of the open areas MC.

Referring to FIGS. 6A and 6B, in an embodiment, protrusion parts MS-EP may be arranged in a stripe form on both sides with one open area MC interposed between the protrusion parts MS-EP. A protrusion part MS-EP may be arranged in a form parallel to one side of the square-shaped open area MC, and a concave part MS-GP may be disposed adjacent to the protrusion part MS-EP. In an embodiment, the protrusion part MS-EP may protrude convexly in the direction of the fourth direction axis DR4, and the concave part MS-GP may be concavely recessed in the third direction axis DR3 direction. The protrusion part MS-EP in a form parallel to one side of the rectangular open area MC may be formed by providing laser light in a direction parallel to the first direction (Y-axis direction) in the mask manufacturing method of an embodiment.

FIG. 6A shows an embodiment in which a protrusion part MS-EP and a concave part MS-GP are arranged on both sides with one open area MC in parallel with the long side direction of the rectangular open area MC. Although FIG. 6A illustrates that two protrusion parts MS-EP and two concave parts MS-GP are disposed between adjacent open areas MC, the embodiment is not limited thereto.

For example, one protrusion part MS-EP and one concave part MS-GP maybe disposed between neighboring open areas MC, or unlike the drawing, three or more protrusion parts MS-EP and three or more concave parts MS-GP may be arranged between neighboring open areas MC. In other examples, a protrusion part and a concave part may not be disposed in an area between two adjacent open areas MC, and two or more open areas MC may be disposed between two adjacent protrusion parts MS-EP. Unlike the examples in FIGS. 6A and 6B, the protrusion part MS-EP and the concave part MS-GP may extend in a direction parallel to the short side of the rectangular open area MC.

Referring to FIGS. 6C and 6D, open areas MC are defined in the mask sheet MS-c according to an embodiment, and the protrusion parts MS-EPc and the concave parts MS-GPc adjacent to the open areas MC may be formed to form a closed curve surrounding the open areas MC in a plan view, respectively. For example, the protrusion parts MS-EPc and the concave parts MS-GPc may each have a shape of a simple closed curve in a plan view.

In an embodiment shown in FIGS. 6C and 6D, each of the open areas MC has a rectangular shape in a plan view, and the protrusion part MS-EPc may be arranged along the shape of the open area MC to form a rectangular line in a plan view at the periphery of each of these open areas MC. The protrusion part MS-EPc may be formed to be spaced apart from the open area MC by a distance. Concave parts MS-GPc may be defined along the shape of the protrusion part MS-EPc at the periphery of the protrusion part MS-EPc. The concave part MS-GPc may be defined adjacent to the protrusion part MS-EPc. The mask support part SSP-c may be formed outside the open area MC to surround the open area MC.

In other examples, the arrangement form of the mask support part included in the mask sheet is not limited to that shown in FIGS. 6A to 6D, and the arrangement form, and shape of the support part may be changed as long as the arrangement and the shape may support the mask sheet.

Hereinafter, a method of manufacturing a mask according to an embodiment will be described with reference to FIGS. 7 to 15B. In the description of the mask manufacturing method according to the embodiment, the same contents already described with reference to FIGS. 1 to 6D will not be repeated.

Figure 7:
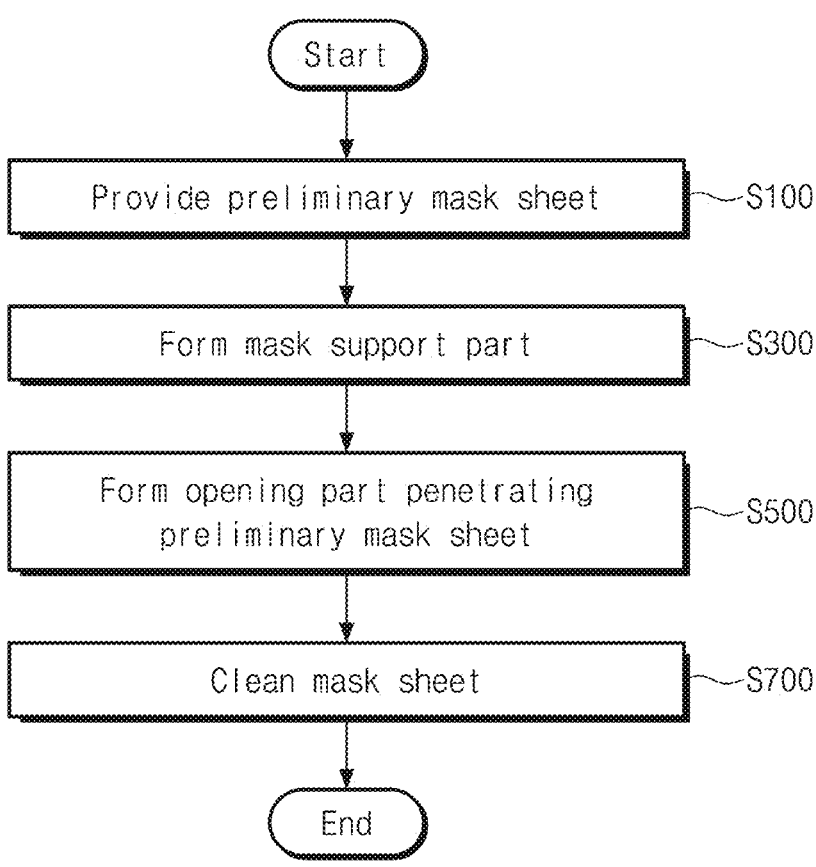
FIG. 7 is a flowchart illustrating a method of manufacturing a mask according to an embodiment.
Figure 8A:
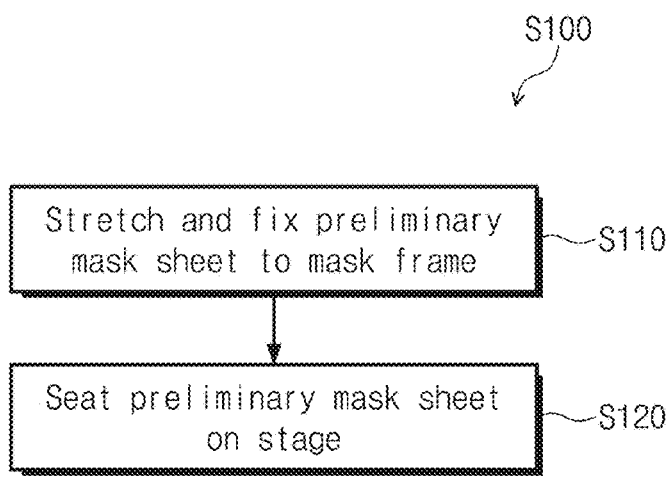
FIG. 8A is a flowchart of an operation of a method of manufacturing a mask according to an embodiment.
Figure 8B:
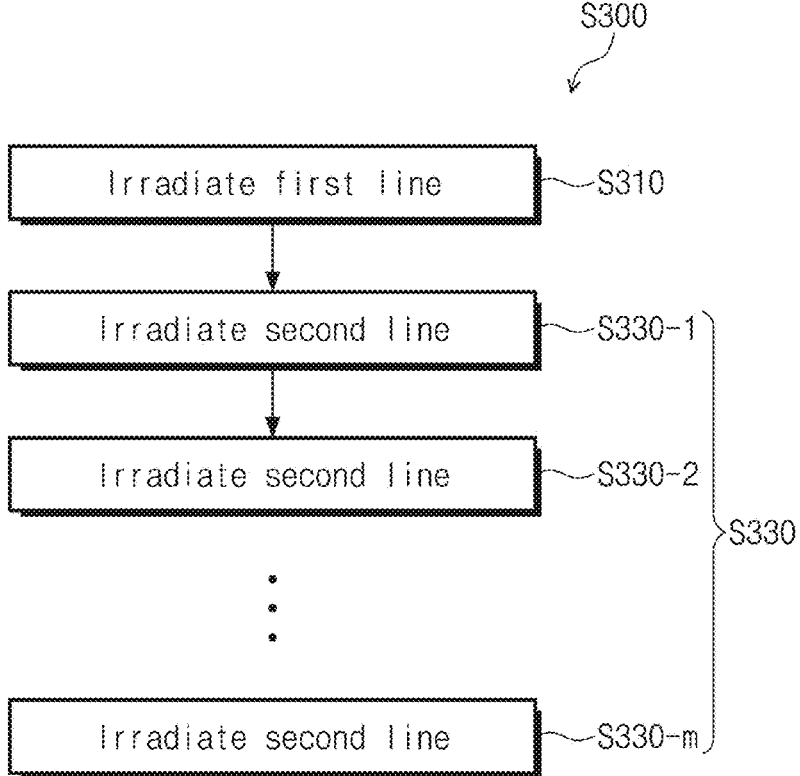
FIG. 8B is a flowchart of an operation of a method of manufacturing a mask according to an embodiment.

FIG. 7 is a flowchart illustrating a method of manufacturing a mask according to an embodiment. FIGS. 8A and 8B are respectively flowcharts for an operation of the method for manufacturing a mask according to an embodiment.

The method of manufacturing a mask according to an embodiment may include providing a preliminary mask sheet S100, forming a mask support part S300, and forming an opening part S500. The mask manufacturing method according to an embodiment may further include cleaning a mask S700. The order of forming the mask support part S300 and forming the opening part S500 may be changed. After providing the preliminary mask sheet S100, forming the opening part S500 may be performed first, and then forming the mask support part S300 may be performed.

In the mask manufacturing method of an embodiment, providing the preliminary mask sheet S100 may include extending and fixing the preliminary mask sheet to the mask frame S110 and mounting the preliminary mask sheet on the stage S120.

Forming the mask support part S300 may include forming a mask support part including a concave part recessed from the first surface and a protrusion part adjacent to the concave part and protruding from the first surface by repeatedly irradiating the first laser light on the first surface of the preliminary mask sheet.

Forming the mask support part S300 may include irradiating a first line S310 and irradiating a second line S330 with a laser. Irradiating the second line S330 may be repeated multiple times S330-1, S330-2, . . . S330-m. Here, m may be an integer of 9 or more.

Irradiating the first line S310 may include irradiating the first laser light along a virtual first line extending in a first direction, and irradiating the second line S330 may include moving the preliminary mask sheet in a second direction different from the first direction, and then further irradiating the first laser light along a second virtual line extending in the first direction. In forming the mask support part, irradiating the first laser light in parallel in the first direction may be performed times. Forming the mask support part S300 including irradiating the first line S310 and irradiating the second line S330 will be described in more detail below.

Forming the opening part S500 may include forming an opening part adjacent to the protrusion part of the mask support part and penetrating the preliminary mask sheet by irradiating a second laser light to the second surface of the preliminary mask sheet.

Cleaning S700 may be performed after the mask support part and the opening part are formed. Cleaning S700 may be to remove an oxide film formed during laser processing using a cleaning solution. Cleaning S700 may also include removing dust generated during the mask manufacturing process by using a suction device or the like. Cleaning S700 may include removing an oxide film or dust generated during the manufacturing process.

Figure 9:
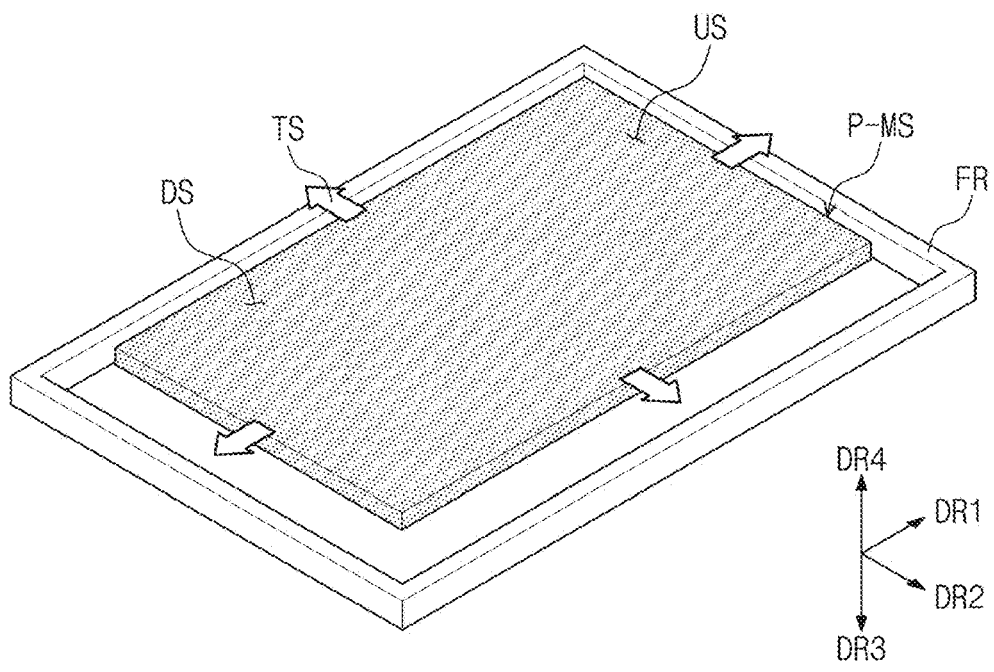
FIG. 9 is a schematic diagram illustrating operations of a method of manufacturing a mask according to an embodiment.
Figure 10:
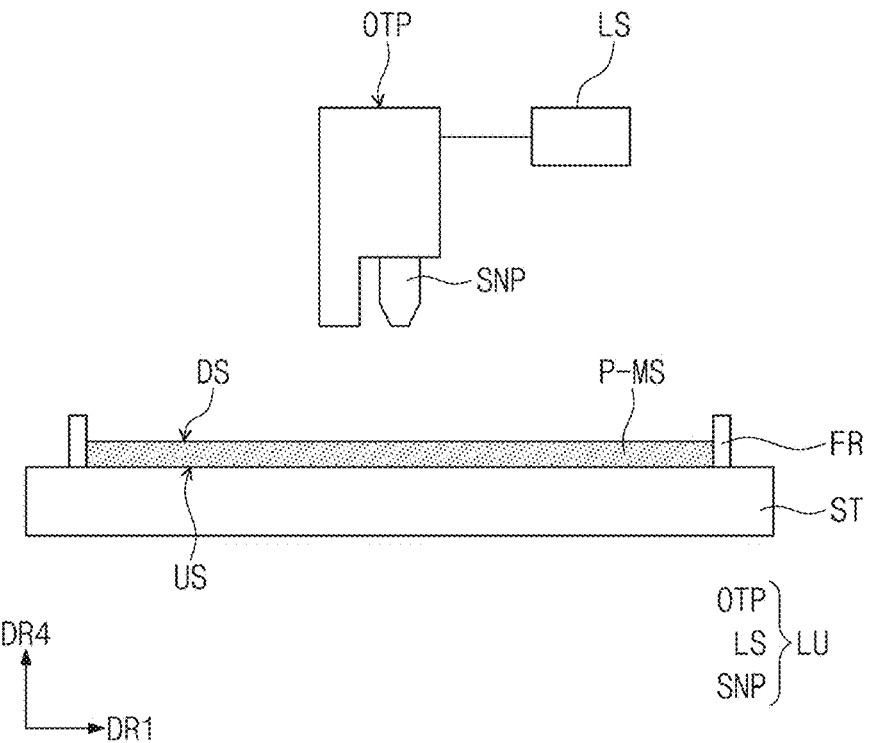
FIG. 10 is a schematic diagram illustrating operations of a method of manufacturing a mask according to an embodiment.

FIGS. 9 and 10 are views showing an operation of the mask manufacturing method according to an embodiment, respectively. FIG. 9 illustrates extending and fixing the preliminary mask sheet of FIG. 8A to the mask frame S110. FIG. 10 shows seating the preliminary mask sheet of FIG. 8A on the stage S120.

Referring to FIGS. 7 to 10, preparing the preliminary mask sheet S100 includes providing a preliminary mask sheet P-MS including a first surface DS and a second surface US facing each other. The preliminary mask sheet P-MS may correspond to a member to be processed before being processed into a mask. The preliminary mask sheet P-MS may include an alloy of iron and nickel. The preliminary mask sheet P-MS may include Invar. The thermal expansion coefficient of the preliminary mask sheet P-MS may be about 5 ppm/° C. or less. The thickness of the preliminary mask sheet P-MS may be about 20 μm or more and about 200 μm or less.

Extending and fixing the preliminary mask sheet to the mask frame S110 may include applying a tensile force TS to the preliminary mask sheet P-MS to tension the preliminary mask sheet P-MS and then fixing the preliminary mask sheet P-MS to the mask frame FR. The preliminary mask sheet P-MS may be fixed to the mask frame FR by a method such as welding after tensioning.

Seating the preliminary mask sheet on the stage S120 may include disposing the preliminary mask sheet P-MS on the stage ST so that the first surface DS of the preliminary mask sheet P-MS is exposed to the outside while the preliminary mask sheet P-MS is fixed to the mask frame FR. In seating the preliminary mask sheet on the stage S120, a laser light providing unit (or part) LU may be disposed on the first surface DS of the preliminary mask sheet P-MS. However, the embodiment is not limited thereto, and when forming the opening part S500 is performed before forming the mask support part S300, the preliminary mask sheet P-MS may be disposed on the stage ST so that the second surface US of the preliminary mask sheet P-MS is exposed to the outside.

The laser light providing unit LU may include a light source unit (or part) LS, an optical unit (or part) OTP, and a scan unit (or part) SNP. In seating the preliminary mask sheet on the stage S120, a preliminary mask sheet may be provided so that the first surface DS of the preliminary mask sheet P-MS is adjacent to the laser light providing unit (or part) LU, and the second surface US of the preliminary mask sheet P-MS is adjacent to the stage.

Figure 11A:
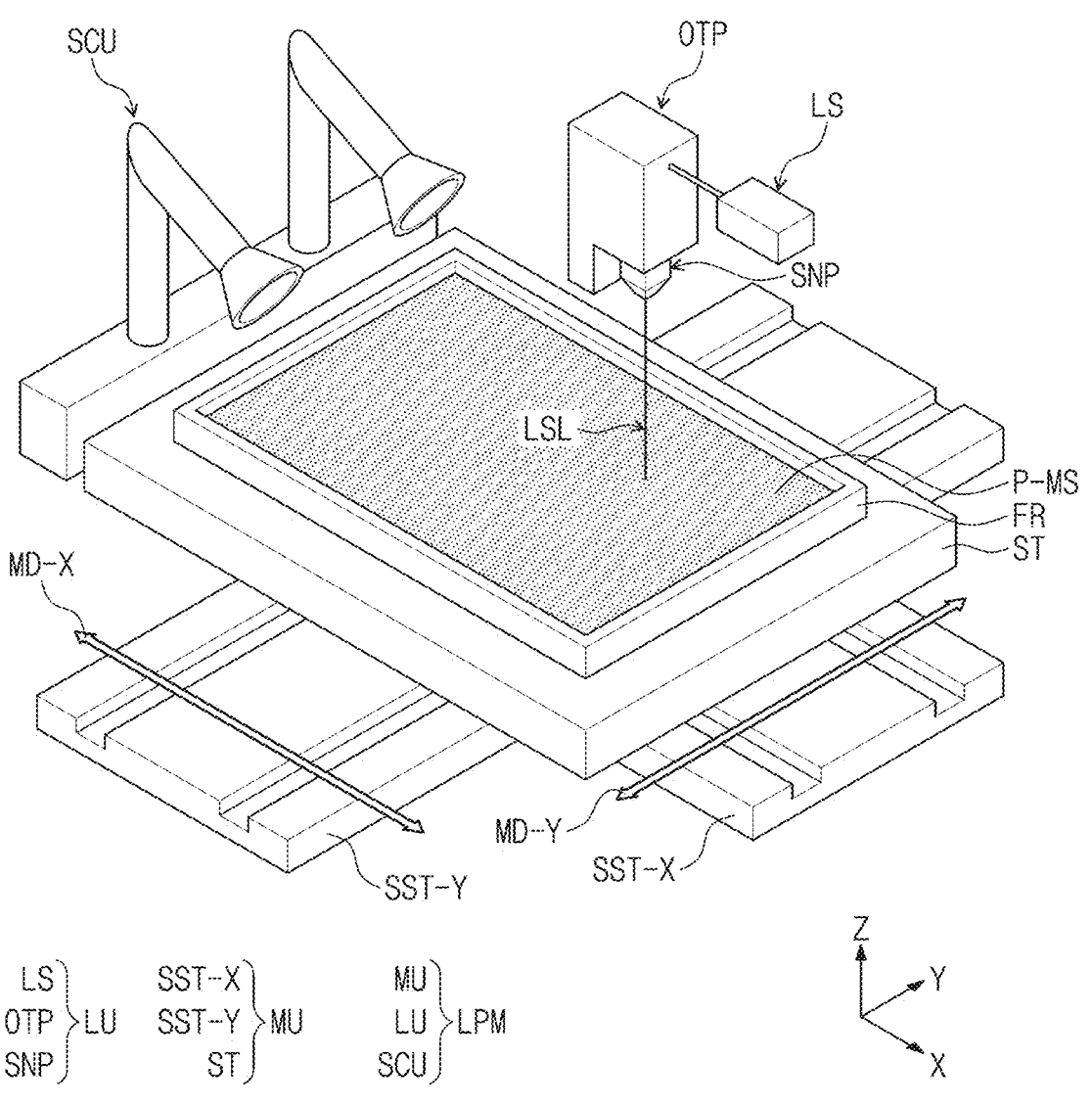
FIG. 11A is a schematic perspective view illustrating a laser processing device according to an embodiment.
Figure 11B:
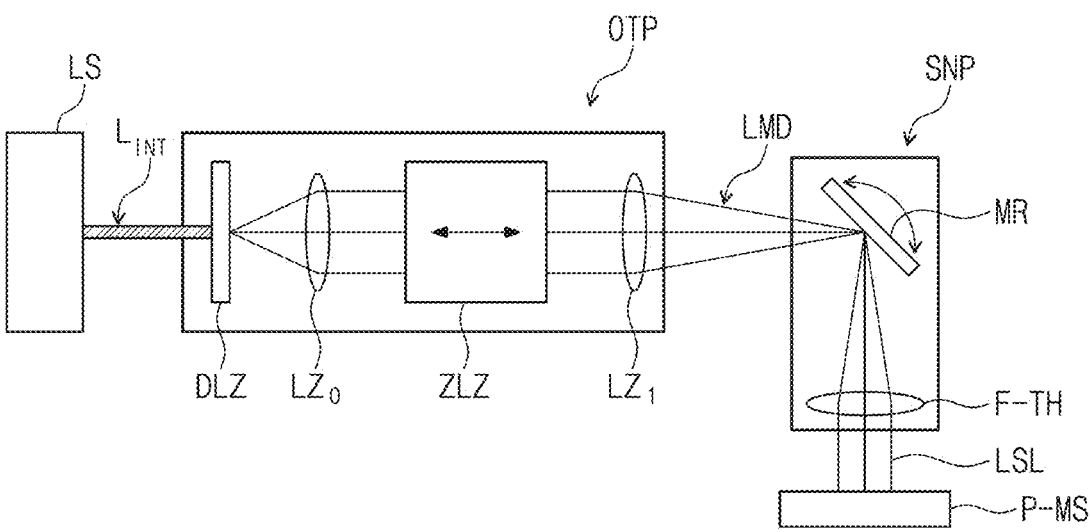
FIG. 11B is a view schematically showing a laser light providing unit (or part) according to an embodiment.

FIG. 11A is a schematic perspective view illustrating a laser processing device used in a method for manufacturing a mask according to an embodiment. FIG. 11B is a view schematically showing a laser light providing unit (or part) according to an embodiment.

Referring to FIGS. 11A and 11B, a laser processing device LPM according to an embodiment may include a support unit (or part) MU and a laser light providing unit (or part) LU. The laser light providing unit (or part) LU may be located on the support unit (or part) MU. A member to be processed may be disposed between the support unit (or part) MU and the laser light providing unit (or part) LU. FIG. 11A illustrates a preliminary mask sheet P-MS fixed to the mask frame FR to be processed.

Referring to FIG. 11A, the laser processing device LPM may further include a suction part SCU. The suction part SCU may be disposed on one side of the stage ST on which the member to be processed is disposed. Unlike the example in FIG. 11A, a suction part SCU may also be disposed on the other side of the stage ST, or disposed above the stage ST. Dust generated during the mask manufacturing process may be removed by using the suction part SCU. Contaminants such as dust generated during forming of the mask support part using laser light S300 and the forming of the opening part S500 may be removed by the suction part SCU.

The support unit (or part) MU of the laser processing device LPM according to an embodiment seats and fixes the preliminary mask sheet P-MS, which is a member to be processed, and moves the preliminary mask sheet P-MS in the X-axis direction X, or in the Y-axis direction Y.

The X-axis, Y-axis, and Z-axis disclosed in FIG. 11A and the drawings to be described later are relative directions, and the extension direction of the X-axis and the extension direction of the Y-axis are orthogonal to each other, and the extension direction of the Z-axis may be a direction normal to a plane defined by the X-axis and the Y-axis. In this specification, the Y-axis direction Y may be described as a first direction, and the X-axis direction X may be described as a second direction, which corresponds to a relative direction. In this specification, it has been described that the Y-axis direction Y is the direction of the first direction axis DR1, and the X-axis direction X is the direction of the second direction axis DR2, but embodiments are not limited thereto.

The laser processing device LPM may include a stage ST movable in each of the Y-axis direction Y (first direction) and the X-axis direction X (second direction) orthogonal to the Y-axis direction. The support unit (or part) MU may include a stage ST, a first direction movement unit SST-Y, and a second direction movement unit (or part) SST-X.

The first direction movement unit (or part) SST-Y and the second direction movement unit (or part) SST-X may be disposed to intersect each other. The first direction movement unit (or part) SST-Y may be disposed on the second direction movement unit (or part) SST-X, and the stage ST may be disposed on the first direction movement unit (or part) SST-Y.

The stage ST may be moved on the first direction movement unit (or part) SST-Y to move the stage ST in the first direction Y. The movement of the stage ST may be performed by controlling the stage ST to move along a groove defined in the first direction movement unit (or part) SST-Y. Even when the laser light providing unit (or part) LU is fixed according to the movement of the stage ST in the first direction Y, the laser light LSL may be provided to the member to be processed while the laser light LSL is moved along the first direction Y. When the stage ST moves along the first direction Y, the laser light LSL may be provided along the first processing direction MD-Y.

In order to move the stage ST in the second direction X, the first direction movement unit (or part) SST-Y on which the stage ST is seated may be moved on the second direction movement unit (or part) SST-X. The movement of the stage ST may be performed by controlling the movement of the first direction movement unit (or part) SST-Y along a groove defined in the second direction movement unit (or part) SST-X. Even when the laser light providing unit (or part) LU is fixed according to the movement of the stage ST in the second direction X, the laser light LSL may be provided to the member to be processed by moving a selected distance in the second direction X. The laser light LSL may be provided after moving in the second processing direction MD-X according to the movement of the stage ST in the second direction X.

In other examples, the first direction movement unit (or part) SST-Y and the second direction movement unit (or part) SST-X may be arranged to intersect each other, and the second direction movement unit (or part) SST-X may be disposed on the first direction movement unit (or part) SST-Y, and the stage ST may be disposed on the second direction movement unit (or part) SST-X. The movement of the stage ST in the first direction Y may be performed by controlling the movement of the second direction movement unit (or part) SST-X along a groove defined in the first direction movement unit (or part) SST-Y. The movement of the stage ST in the second direction X may be performed by controlling the stage ST to move along a groove defined in the second direction movement unit (or part) SST-X.

The embodiment is not limited to that shown in FIG. 11A, and the like, and in the laser processing device LPM, the stage ST may be moved in the first direction and the second direction by a control unit (not shown) without a separate direction movement unit (or part). Different types of driving parts may be included, and the stage ST may be controlled to move in the X-axis or Y-axis direction.

In the laser processing device LPM according to an embodiment described with reference to FIG. 11A, and the like, although it has been described that the irradiation direction of the light provided from the laser light providing unit (or part) LU is adjusted according to the movement of the support unit (or part) MU, the embodiment is not limited thereto. For example, the laser light providing unit (or part) LU may be moved in the first direction Y and in the second direction X by being controlled by a signal received from a control unit (not shown).

The laser light providing unit (or part) LU may include a light source unit (or part) LS that provides a source laser light, an optical unit (or part) OTP that processes the source laser light by diffracting, splitting, and redirecting the light provided from the light source unit (or part) LS, and a scan unit (or part) SNP that provides the laser light processed by the optical unit (or part) OTP as final laser light by adjusting the size and focus.

FIG. 11B is a diagram schematically illustrating a laser light providing unit (or part) LU. Referring to FIG. 11B, the initial laser light LINT may be provided from the light source unit (or part) LS to be incident on the optical unit (or part) OTP.

The optical unit (or part) OTP may include optical elements such as a diffractive optical element DLZ and a zoom lens ZLZ. The diffractive optical element DLZ may branch the initial laser light LINT provided from the light source unit (or part) LS into sub laser lights. The branched laser light passes through the zoom lens ZLZ, and the interval between the sub laser lights may be adjusted. The optical unit (or part) OTP may further include additional optical lenses $LZ_0$ and $LZ_1$ for condensing or splitting laser light generated between the optical elements or from the optical elements. Although not shown in the drawing, the optical unit (or part) OTP, may include additional mirror configurations. The configuration of the optical unit (or part) OTP is not limited to that shown in FIG. 11B, and the diffractive optical element DLZ, the zoom lens ZLZ, the optical lenses $LZ_0$ and $LZ_1$, and the mirrors may be selectively included or omitted, and the arrangement order may be changed.

The scan unit (or part) SNP may convert the laser light $L_{MD}$ processed from the optical unit (or part) OTP into the final laser light LSL and may provide the converted laser light LSL. The scan unit (or part) SNP may include a mirror MR for controlling the movement direction of the laser light $L_{MD}$ provided from the optical unit (or part) OTP, and a focus lens F-TH for adjusting the size of the laser light beam. The focus lens F-TH may be an F-theta lens, and the beam size and precision of the final laser light LSL may be controlled by using the focus lens F-TH.

Figure 12A:
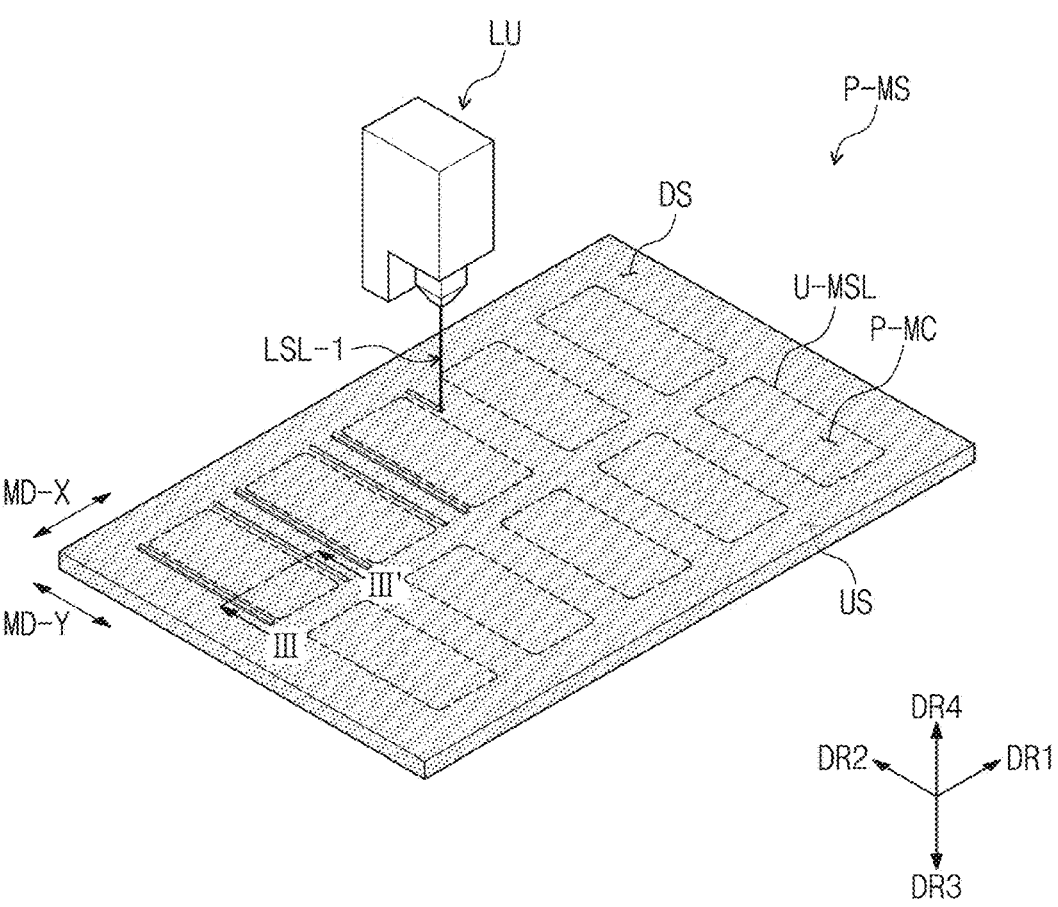
FIG. 12A is a schematic diagram illustrating operations of a method of manufacturing a mask according to an embodiment.
Figure 12B:
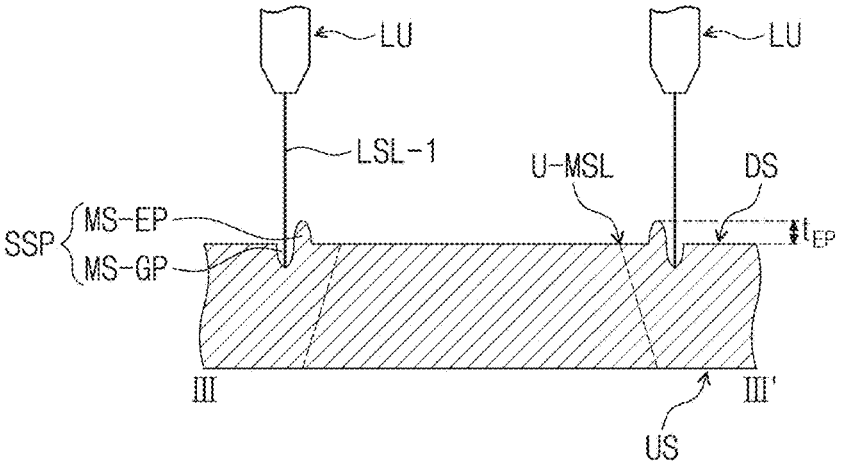
FIG. 12B is a schematic diagram illustrating operations of a method of manufacturing a mask according to an embodiment.

FIGS. 12A and 12B schematically show an operation of a method of manufacturing a mask according to an embodiment, respectively. FIGS. 12A and 12B are diagrams showing a part of the forming a mask support part SSP including a concave part MS-GP recessed from the first surface DS by irradiating the first laser light LSL-1 to the first surface DS of the preliminary mask sheet P-MS and a protrusion part MS-EP adjacent to the concave part MS-GP and protruding from the first surface DS. The first laser light LSL-1 may be a laser light provided from the laser light providing unit (or part) LU of the laser processing device LPM according to an embodiment described with reference to FIGS. 11A and 11B.

Referring to FIGS. 12A and 12B, the first laser light LSL-1 provided in forming the mask support part SSP S500 may be provided to the first surface DS of the preliminary mask sheet P-MS adjacent to the preliminary open area P-MC. The preliminary open area P-MC may be formed as the opening part OP (refer to FIG. 5) in the final mask state. The preliminary open area P-MC may then be defined as a processing line U-MSL corresponding to a portion provided as the opening part OP (refer to FIG. 5). The part shown as the processing line U-MSL is a virtual line, and shows a portion corresponding to the outline to which the second laser light LSL-2 (refer to FIG. 15A) is irradiated to form the opening part OP (refer to FIG. 5) thereafter.

The first laser light LSL-1 may be provided to an outer portion of the processing line U-MSL on the first surface DS of the preliminary mask sheet P-MS. The first laser light LSL-1 may be repeatedly provided to the first surface DS of the preliminary mask sheet P-MS. The first laser light LSL-1 may be irradiated along a direction parallel to the second direction axis DR2. The first laser light LSL-1 may be provided along the first processing direction MD-Y. For example, in an embodiment, the preliminary mask sheet P-MS may be moved along the first processing direction MD-Y, and accordingly, the first laser light LSL-1 may be sequentially provided in parallel with the first processing direction MD-Y. The movement of the preliminary mask sheet P-MS may correspond to the movement of the stage ST (refer to FIG. 11A) in the support unit (or part) MU (refer to FIG. 11A) described above.

The first laser light LSL-1 may be repeatedly irradiated to the same portion. Accordingly, the protrusion part MS-EP is formed in a direction spaced apart from the first surface DS of the preliminary mask sheet P-MS due to a laser overwriting phenomenon caused by repeated irradiation of laser light. The concave part MS-GP is continuously irradiated with the first laser light LSL-1 repeatedly, and finally the protrusion part MS-EP adjacent to the concave part MS-GP is grown and formed. The protrusion part MS-EP may be formed adjacent to the concave part MS-GP. As the protrusion part MS-EP is formed, the concave part MS-GP may also be formed to gradually increase. The protrusion part MS-EP and the concave part MS-GP may be formed together in one process operation.

Referring to FIGS. 12A and 12B, the first laser light LSL-1 may be irradiated to the portion of the first surface DS of the preliminary mask sheet P-MS on both sides of the processing line U-MSL, respectively. Accordingly, protrusion parts MS-EP may be formed on both sides of the preliminary open area P-MC with the preliminary open area P-MC interposed between the protrusion parts MS-EP. The protrusion part MS-EP may be formed parallel to one side of the preliminary open area P-MC to correspond to the first processing direction MD-Y of the first laser light LSL-1.

Forming the mask support part SSP including the protrusion part MS-EP and the concave part MS-GP by using the first laser light LSL-1 may include irradiating the first line S310 (refer to FIG. 8B) and irradiating the second line S330 (refer to FIG. 8B) repeated times.

The first laser light LSL-1 used in the method of manufacturing a mask according to an embodiment may be a pulse laser having a pulse width of femtoseconds ($10^{-15}$) to picoseconds ($10^{-12}$).

The wavelength of the first laser light LSL-1 may be about 400 nm to about 600 nm. The point at which the first laser light LSL-1 provided as a pulse laser that exhibits the maximum intensity may be in a wavelength range of about 400 nm to about 600 nm.

The intensity of the first laser light may be about 1.25 GW/m$^2$ or more. The maximum intensity of the first laser light LSL-1 may be about 1.25 GW/m$^2$ or more. The intensity of the first laser light LSL-1 provided in forming the mask support part SSP S500 is about 1.25 GW/m$^2$ or more, and the first laser light LSL-1 may be provided by overlapping pulse lasers.

A beam size of the first laser light LSL-1 may be about 10 μm to about 100 μm. The beam size of the first laser light LSL-1 may be the beam size of the laser light LSL that is finally provided as a preliminary mask sheet through the scan unit (or part) SNP of the laser light providing unit (or part) LU.

The first laser light includes pulse lasers sequentially provided in a first direction, and in forming the mask support part S300 (refer to FIG. 8B), at least part of the neighboring pulse lasers may overlap each other.

FIGS. 12A and 12B may illustrate a part of a method of manufacturing the mask sheet MS according to the embodiment described with reference to FIGS. 6A and 6B described above. Although not shown in the drawing, the mask support part SSP-c included in the mask sheet MS-c according to the embodiment described with reference to FIGS. 6C and 6D may be also formed by the same method as the above-described method. For example, the first laser light LSL-1 may be provided along the outer edge spaced at a selected interval from the processing line U-MSL corresponding to a portion provided as the opening part OP (refer to FIG. 5) thereafter. The first laser light LSL-1 is sequentially provided around each of the preliminary open areas P-MC in the above-described manner so that the protrusion part MS-EPc (refer to FIG. 6C) and the concave part MS-GPc (refer to FIG. 6C) may be formed together in one process operation to surround the preliminary open area P-MC.

Figure 13:
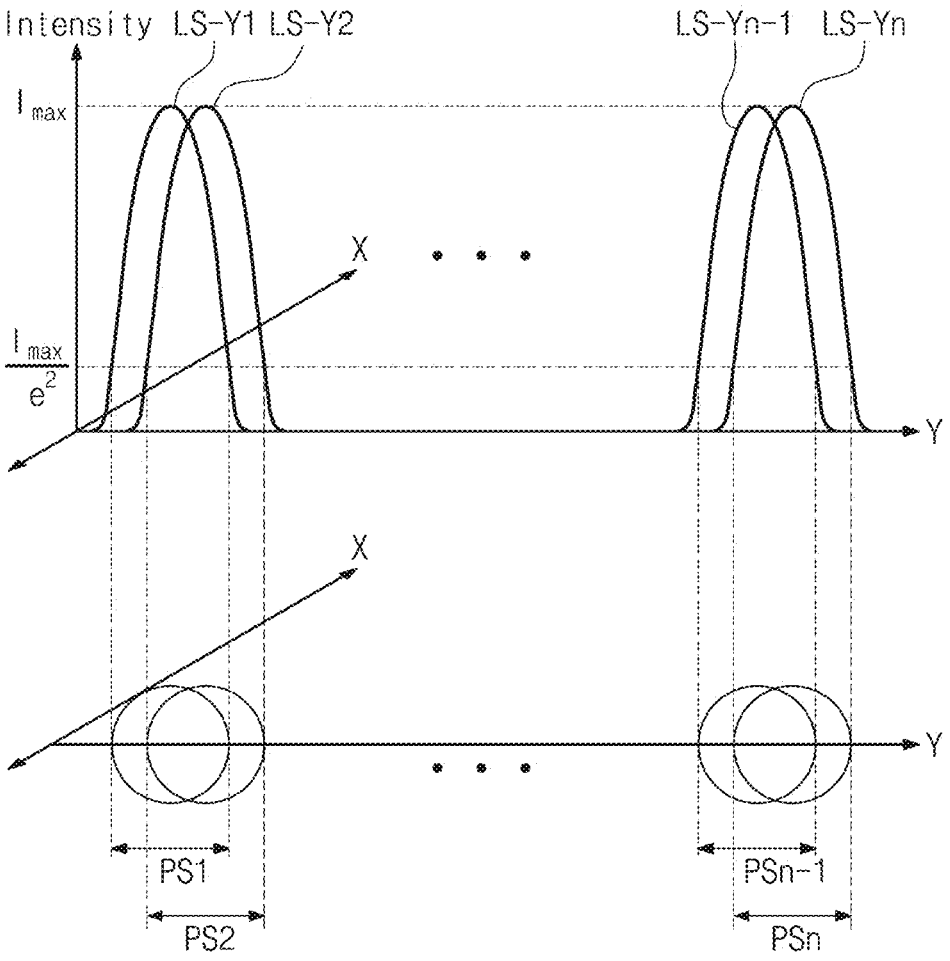
FIG. 13 is a schematic diagram showing a degree of overlap of pulses of laser light.

FIG. 13 is a diagram showing a degree of overlap of pulses of laser light. FIG. 13 illustrates pulse lasers LS-Y1, LS-Y2, . . . LS-Yn-1, LS-Yn sequentially provided along the first direction Y. The pulse lasers LS-Y1, LS-Y2, . . . LS-Yn-1, LS-Yn sequentially provided along the first direction Y shown in FIG. 13 may correspond to the first laser light LSL-1 provided along the first processing direction MD-Y in FIG. 12A.

Referring to FIG. 13, at least part of neighboring pulse lasers LS-Y1, LS-Y2, . . . LS-Yn-1, LS-Yn may overlap each other. In the method of manufacturing a mask according to an embodiment, a pulse overlap ratio of the pulse lasers LS-Y1, LS-Y2, . . . LS-Yn-1, LS-Yn provided as the first laser light may be about 80% or more. In case that the pulse overlap ratio of the neighboring pulsed lasers is about 80% or more, the mask support part SSP (refer to FIG. 12B) may be formed by the laser overwriting phenomenon. When the pulse overlap ratio of the neighboring pulse lasers is about 80% or more, and the intensity is about 1.25 GW/m$^2$ or more, the mask support part SSP (refer to FIG. 12B) may be effectively formed.

In an embodiment, the pulse overlap ratio corresponds to the overlap ratio of the first pulse width PS1 of the first pulse laser LS-Y1 and the second pulse width PS2 of the second pulse laser LS-Y2. The first pulse width PS1 and the second pulse width PS2 may each correspond to diameters in cross-sections of the first pulse laser LS-Y1 and the second pulse laser LS-Y2 at a laser pulse intensity of $I_{max}/e^2$. The diameter in the cross section of the pulse laser parallel to the cross section defined by the first direction (Y axis) Y and the second direction (X axis) X at the laser pulse intensity of $I_{max}/e^2$ may correspond to the pulse width. $I_{max}$ corresponds to the maximum intensity of the first pulse laser LS-Y1 and the second pulse laser LS-Y2.

In an embodiment, the pulse overlap ratio may be expressed by Equation 1 below.

$$\text{Pulse overlap ratio (\%)} = (1 - v/ps \times f) \times 100 \qquad \text{[Equation 1]}$$

In Equation 1, v is the scan speed of the first laser light, PS is the diameter in the cross section of the pulsed laser at an intensity of $I_{max}/e^2$ of the first laser light, and f is the frequency of the first laser light.

In the sequentially provided n pulse lasers LS-Y1, LS-Y2, . . . LS-Yn-1, LS-Yn, the pulse overlap ratio of the neighboring pulse lasers may be about 80% or more. The pulse overlap ratio of the pulse width PSn-1 of the (n−1)-th pulse laser and the pulse width PSn of the n-th pulse laser may be about 80% or more. In an embodiment, n may be 10 or more.

Referring to FIG. 13, n pulse lasers LS-Y1, LS-Y2, . . . LS-Yn-1, LS-Yn may be sequentially provided along the first direction Y. Positions in the second direction X of the n pulse lasers LS-Y1, LS-Y2, . . . LS-Yn-1, LS-Yn sequentially provided along the first direction Y may be the same. Sequentially providing n pulse lasers LS-Y1, LS-Y2, . . . LS-Yn-1, LS-Yn along the first direction Y at the same position in the second direction X includes a first line irradiation operation of irradiating a first laser light along a virtual first line (a virtual line extending in a first direction having the same second direction position).

Figure 14:
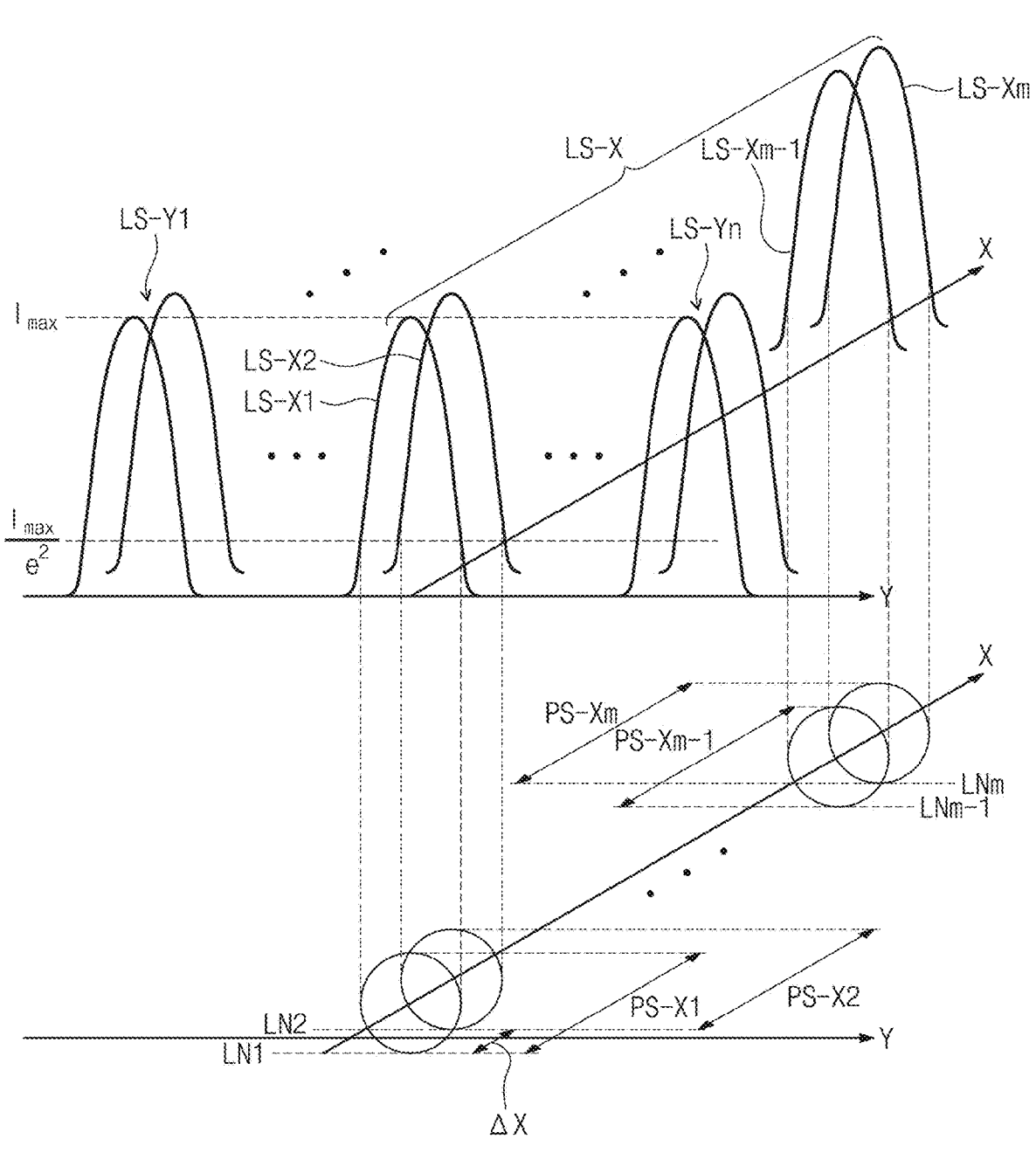
FIG. 14 is a schematic diagram illustrating a line overlapping diagram of laser light.

FIG. 14 is a diagram illustrating a line overlapping diagram of laser light. FIG. 14 illustrates pulse lasers LS-X1, LS-X2, . . . LS-Xn-1, LS-Xn sequentially provided along the second direction X. The pulse lasers LS-X1, LS-X2, . . . LS-Xn-1, LS-Xn sequentially provided along the second direction X shown in FIG. 14 may correspond to the first laser light LSL-1 provided along the second processing direction MD-X in FIG. 12A. LS-Y1, LS-X, and LS-Yn in FIG. 14 correspond to respective positions of the pulse lasers provided in the first direction Y in FIG. 13 in the first direction Y, and may correspond to the laser light provided while moving in the second direction X.

In an embodiment, forming the mask support part S300 (refer to FIG. 8B) may include the first line irradiation operation S310 (refer to FIG. 8B) of irradiating a first laser light along a virtual first line LN1 extending in the first direction Y, and the second line irradiation operation S330 (refer to FIG. 8B) of additionally irradiating the first laser light along a virtual second line LN2 extending in the first direction Y after moving the preliminary mask sheet in the second direction X different from the first direction Y. The second line irradiation operation S330 may be performed times 9 or more times.

The first direction Y and the second direction X may be perpendicular to each other. The first direction Y corresponds to the first processing direction MD-Y shown in FIG. 12A, and the second direction X corresponds to the second processing direction MD-X shown in FIG. 12A. Forming the mask support part S300 (refer to FIG. 8B) may include irradiating a first laser light to the preliminary mask sheet along the first direction Y, moving the preliminary mask sheet in the second direction X by a selected interval, and repeatedly performing the process of irradiating the preliminary mask sheet with the first laser light along the first direction Y again.

FIG. 14 shows a mask support part forming operation proceeding with m line irradiation operations. In an embodiment, m may be 10 or more. The process of irradiating the first laser light to the preliminary mask sheet along the first direction Y may be performed 10 times or more while moving at a selected interval in the second direction X.

Referring to FIG. 14, neighboring pulse lasers among pulse lasers LS-X1, LS-X2, . . . , LS-Xm-1, LS-Xm overlap each other at least partially in the second direction X. In the mask manufacturing method of an embodiment, the line overlap ratio of the pulse lasers LS-X1, LS-X2, . . . , LS-Xm-1, LS-Xm provided as the first laser light may be about 70% or more. In the case where the line overlap ratio of the neighboring pulse lasers in the second direction X is about 70% or more, the mask support part SSP (refer to FIG. 12B) may be formed to have the protrusion part MS-EP (refer to FIG. 12B) having a selected thickness or more by the laser overwriting phenomenon.

The line overlap ratio is an overlap ratio of a pulse width PS-X1 in the second direction X of the first line pulse laser LS-X1 and a pulse width PS-X2 in the second direction X of the second line pulse laser LS-X2. Here, the pulse widths PS-X1 and PS-X2 are values corresponding to the diameters in cross-sections of the first line pulse laser LS-X1 and the second line pulse laser LS-X2 at an intensity of $I_{max}/e^2$. The diameter in the second direction X in the cross section of the line pulse laser parallel to the cross section defined by the first direction (Y axis) Y and the second direction (X axis) X at the laser pulse intensity of $I_{max}/e^2$ corresponds to the pulse widths PS-X1 and PS-X2. Furthermore, $I_{max}$ corresponds to the maximum intensity of the first line pulse laser LS-X1 and the second line pulse laser LS-X2.

In an embodiment, the line overlap ratio may be represented by Equation 2 below.

$$\text{Line overlap ratio (\%)} = (1 - \Delta X/PS) \times 100 \qquad \text{[Equation 2]}$$

In Equation 2, $\Delta X$ is the movement distance of the preliminary mask sheet in the second direction X, and PS is the pulse width at the intensity of $I_{max}/e^2$ of the first laser light.

Referring to FIG. 14, $\Delta X$ in Equation 2 corresponds to the interval between the neighboring virtual lines LN1, LN2, . . . , LNm-1, LNm, and the pulse width PS may correspond to a diameter in a cross section of the line pulse laser parallel to a cross section defined by the first direction (Y axis) Y and the second direction (X axis) X at the laser pulse intensity of $I_{max}/e^2$.

The line overlap ratio of neighboring pulse lasers among the m line pulse lasers LS-X1, LS-X2, . . . , LS-Xm-1, LS-Xm provided by moving a selected interval in the second direction X and having the same position in the first direction Y may be about 70% or more. The line overlap ratio of the pulse width PS-Xm-1 of the line pulse laser LS-Xm-1 of the (m−1)-th line LNm-1 and the pulse width PS-Xm of the m-th line pulse laser LS-Xm may be about 70% or more. In an embodiment, m may be 10 or more.

Referring to FIG. 14, pulse lasers may be sequentially provided along the first direction Y while moving at selected intervals in the second direction X along the m virtual lines LN1, LN2, . . . , LNm-1, LNm. In FIG. 14, n pulse lasers LS-Y1, LS-Y2, . . . LS-Yn-1, LS-Yn may be sequentially provided along the first direction Y in each virtual line. Providing n pulse lasers LS-Y1, LS-Y2, . . . LS-Yn-1, LS-Yn sequentially along the first direction Y in a neighboring virtual line moving in the second direction X may be a second line irradiation operation.

Figure 15A:
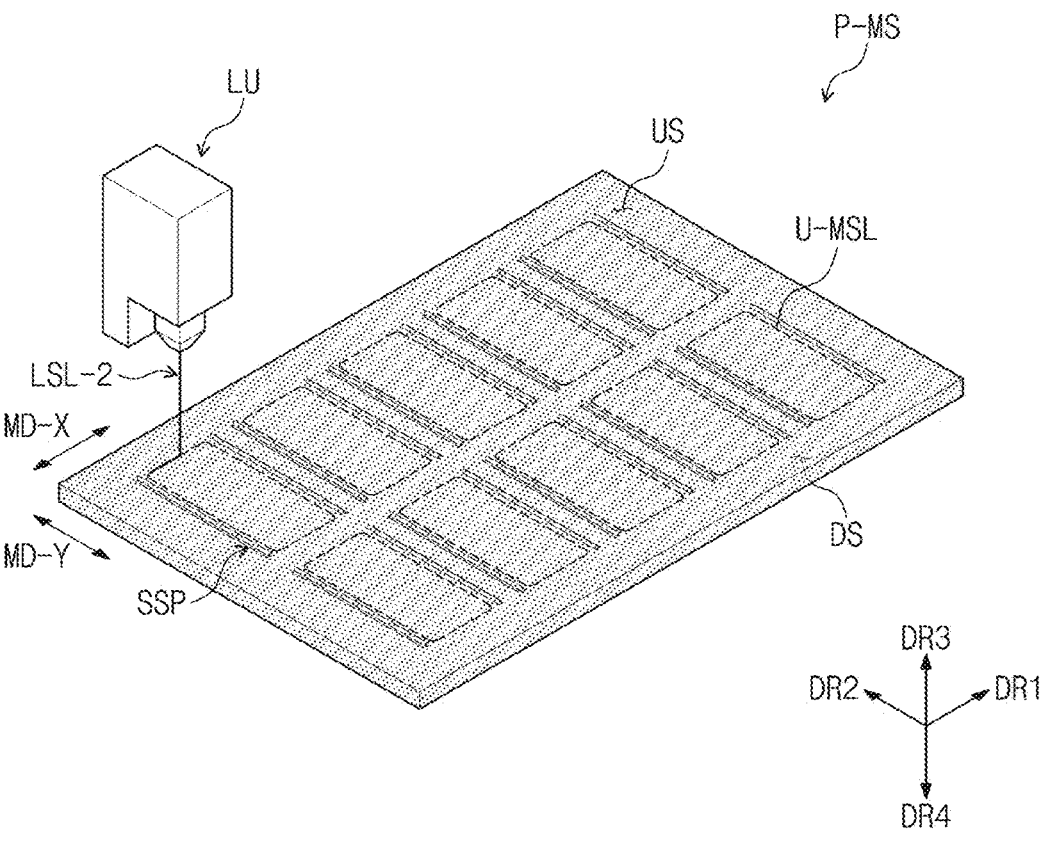
FIG. 15A is a schematic diagram illustrating operations of a method of manufacturing a mask according to an embodiment.
Figure 15B:
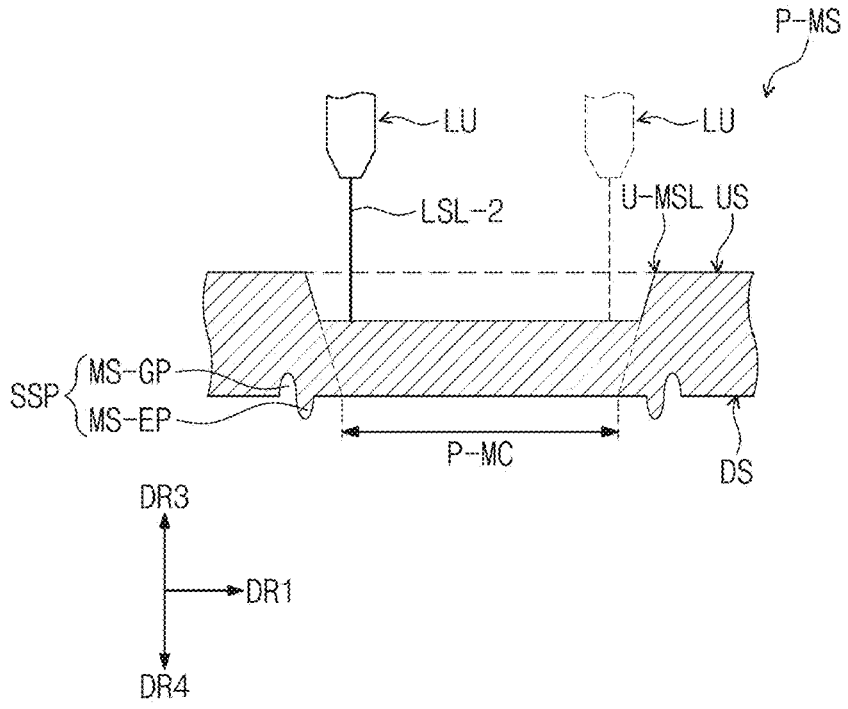
FIG. 15B is a schematic diagram illustrating operations of a method of manufacturing a mask according to an embodiment.

FIGS. 15A and 15B schematically show an operation of a method of manufacturing a mask according to an embodiment, respectively. FIGS. 15A and 15B show the forming the opening part penetrating the preliminary mask sheet S500 (refer to FIG. 7).

Forming the opening part penetrating the preliminary mask sheet S500 (refer to FIG. 7) may include forming the opening part OP (refer to FIG. 5) adjacent to the protrusion part MS-EP and penetrating the first surface DS and the second surface US of the preliminary mask sheet by irradiating the second laser light LSL-2 to the second surface US of the preliminary mask sheet P-MS.

In the preliminary mask sheet P-MS, a processing line U-MSL corresponding to a portion in which the opening part OP (refer to FIG. 5) is defined may be defined in a mask manufactured later. The part shown as the processing line U-MSL is a virtual line, and shows a portion corresponding to the outline to which the second laser light LSL-2 (refer to FIG. 13A) is irradiated to form the opening part OP (refer to FIG. 5) thereafter.

The second laser light LSL-2 may be irradiated onto the second surface US of the preliminary mask sheet P-MS. The surface to which the second laser light LSL-2 is irradiated may be a surface facing the first surface DS to which the first laser light is irradiated. The second laser light LSL-2 may be irradiated along the processing line U-MSL designed in consideration of the shape of the open area MC (refer to FIG. 5) of the mask. The second laser light LSL-2 may be sequentially provided to the entire inner side of the portion indicated by the processing line U-MSL.

The second laser light LSL-2 may be provided from the uppermost surface of the second surface US of the preliminary mask sheet P-MS to the entire inner side of the processing line U-MSL, and may be sequentially provided in the direction of the fourth direction axis DR4 that is the direction of the first surface DS. The second laser light LSL-2 may be provided while moving in the left and right directions to process the inner region of the processing line U-MSL. The second laser light LSL-2 may be provided up to the range of the preliminary open area P-MC defined on the first surface DS of the preliminary mask sheet P-MS to correspond to the open area MC (refer to FIG. 5).

The width of the opening part OP (refer to FIG. 5) formed by irradiating the second laser light LSL-2 may decrease from the second surface US to the first surface DS. The opening part OP (refer to FIG. 5) may be formed by irradiating the second laser light LSL-2 to the preliminary mask sheet P-MS so that the inclination angle $\theta_{MS}$ with respect to the first surface MS-DS of the opening side surface MS-SS (refer to FIG. 5) exposed in the opening part OP (refer to FIG. 5) is about 30 degrees to about 70 degrees.

In an embodiment, the first laser light LSL-1 and the second laser light LSL-2 may be the same type of laser light. For example, the pulse widths of the first laser light LSL-1 and the second laser light LSL-2 may be the same. However, the embodiment is not limited thereto.

The intensities of the first laser light LSL-1 and the second laser light LSL-2 may be the same or different from each other. For example, the intensity of the second laser light LSL-2 for forming the opening part OP may be greater than the intensity of the repeatedly irradiated first laser light LSL-1. However, the embodiment is not limited thereto.

Figure 16A:
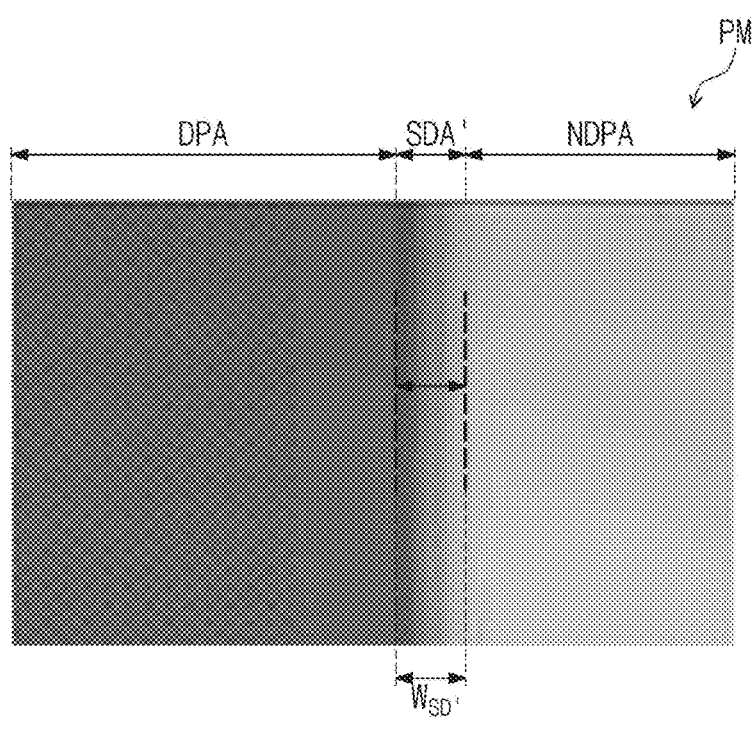
FIG. 16A is an image showing a deposition surface using a comparative example mask.
Figure 16B:
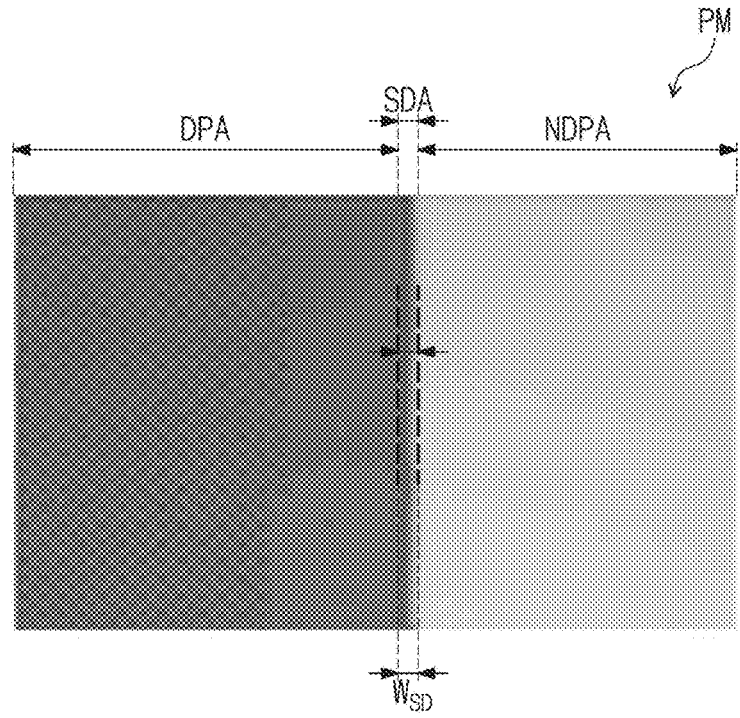
FIG. 16B is an image showing a deposition surface of an embodiment using a mask manufactured by a method according to an embodiment.

FIGS. 16A and 16B are images each showing a deposition portion formed using a mask. FIG. 16A is an image of a comparative example deposition using a comparative example mask. FIG. 16B is an image of a deposition using a mask manufactured according to a method of an embodiment. In the comparative example mask of FIG. 16A, the height of a barrier corresponding to the protrusion part is about 50 μm or more, and in the mask according to the embodiment of FIG. 16B, the height of the protrusion part is about 10 μm or less.

FIGS. 16A and 16B respectively show images of upper surfaces of target substrates PM' and PM after deposition of a deposition material using a mask. Comparing FIGS. 16A and 16B, there is a difference in the area of the shadow regions SDA' and SDA.

FIG. 16A shows a deposition region DPA, a non-deposition region NDPA, and a shadow region SDA' existing between the deposition region DPA and the non-deposition region NDA according to a comparative example. FIG. 16B also shows a deposition region DPA, a non-deposition region NDPA, and a shadow region SDA according to an embodiment using a mask of an embodiment.

Referring to the images of FIGS. 16A and 16B, the width WSD of the shadow region SDA formed after the deposition process is performed using the mask manufactured by the mask manufacturing method of the embodiment is less than the width WSD' of the shadow region SDA' formed after the deposition process is performed using the mask of the comparative example. Based on the area of the same target substrates PM and PM', the area of the deposition region DPA in the embodiment of FIG. 16B may be greater than the area of the deposition region DPA of the comparative example of FIG. 16A.

The mask manufactured by the method of an embodiment includes a protrusion part disposed on the lower surface of the mask sheet, which prevents the target substrate from being dented by maintaining the separation distance from the target substrate. The mask according to the embodiments may increase the area of the deposition region by minimizing the separation distance from the target substrate, and may reduce the shadow region between the deposition region and the non-deposition region. Accordingly, in the mask manufacturing method of an embodiment, a protrusion part having a small thickness of about 10 μm or less is included on the lower surface of the mask sheet, and the method may be used to manufacture a mask used for manufacturing a thin film layer that may meet the specified precision and deposition quality standards.

The mask manufacturing method of an embodiment includes providing a laser light of a certain intensity or more as a pulse laser with a pulse overlap ratio of about 80% or more to form a mask support part, so that the method may be used to manufacture a mask capable of providing the specified deposition quality.

Hereinafter, while referring to embodiments and comparative examples, a mask manufacturing method according to an embodiment and a mask evaluation result according to a change in process conditions of the mask manufacturing method will be described in detail. The examples shown below are examples to help understand the disclosure, and the scope of the disclosure is not limited thereto.

Embodiment

In the results of the embodiments described below, the number of processing lines corresponds to the number of virtual lines in the second direction described with reference to FIG. 14 and the like, and the intensity of the laser light corresponds to the maximum intensity of the pulse laser. The pulse overlap ratio may be defined by Equation 1 and the like described above. The height of the protrusion part corresponds to the height of the protruding part spaced apart from the lower surface of the mask sheet. When that the protrusion part is not formed, the height is marked as "X."

1. Formation of Protrusion Part According to Pulse Overlap Ratio

Table 1 shows the formation of the protrusion part of the mask according to the pulse overlap ratio of the pulse lasers irradiated with the first laser light compared with the comparative example. The wavelength of the first laser light used in comparative examples 1-1 and 1-2 and embodiments 1-1 to 1-4 is about 515 nm, and the beam size is about 12 μm.

TABLE 1

| Classi-fication | Number of pro-cessing lines | Intensity of laser light (GW/m$^2$) | Scan speed (mm/s) | Fre-quency (Hz) | Pulse overlap ratio (%) | Height of protru-sion part (μm) |
|---|---|---|---|---|---|---|
| Comparative example 1-1 | 30 | 2.5 | 30 | 6k | 60 | X |
| Comparative example 1-2 | 30 | 2 | 30 | 7.5k | 68 | X |
| Embodiment 1-1 | 30 | 1.25 | 30 | 12k | 80 | 0.2~0.3 |
| Embodiment 1-2 | 20 | 3.75 | 30 | 15k | 84 | 0.8~1.6 |
| Embodiment 1-3 | 20 | 3.75 | 30 | 30k | 92 | 2.5~3.1 |
| Embodiment 1-4 | 10 | 1.875 | 30 | 60k | 96 | 1.6~2.4 |

Referring to the results of Table 1, the protrusion part is formed on the mask sheet in case that the pulse overlap ratio is about 800 or more. In comparison, comparative examples 1-1 and 1-2 have pulse overlap ratios of about 70% or less, and the pulse overlap ratio is small compared to embodiments 1-1 to 1-4, and accordingly, the protrusion part was not formed.

Referring to the results of Table 1, the pulse overlap ratio may be proportional to the frequency of the provided laser light. The overlap ratio of pulse lasers may increase with an increase in frequency.

Referring to the results of embodiments 1-2 and 1-3, in case that the pulse overlap ratio is large under the process conditions of the same number of processing lines and the intensity of laser light, the height of the formed protrusion part is also increased. The formation of the protrusion part may be easier as the pulse overlap ratio increases.

2. Formation of Protrusion Part According to Pulse Intensity

Table 2 shows the formation of the protrusion part of the mask according to the intensity of the laser light of the pulse lasers irradiated with the first laser light compared with the comparative example. The wavelength of the first laser light used in comparative examples 2-1 and 2-2 and embodiments 2-1 to 2-3 is about 515 nm, and the beam size is about 12 μm.

TABLE 2

| Classi-fication | Number of pro-cessing lines | Intensity of laser light (GW/m$^2$) | Scan speed (mm/s) | Fre-quency (Hz) | Pulse overlap ratio (%) | Height of protru-sion part (μm) |
|---|---|---|---|---|---|---|
| Comparative example 2-1 | 30 | 1.0 | 30 | 12k | 80 | X |
| Embodiment 2-1 | 30 | 1.25 | 30 | 12k | 80 | 0.3~1.6 |
| Embodiment 2-2 | 10 | 1.875 | 30 | 12k | 80 | 0.7~1.7 |
| Comparative example 2-2 | 30 | 2.00 | 30 | 7.5k | 68 | X |
| Embodiment 2-3 | 30 | 3.75 | 30 | 30k | 92 | 5.4~8.5 |

Referring to the results in Table 2, comparing comparative example 2-1 and embodiments 2-1 and 2-2 with the same pulse overlap ratio of 80%, in embodiment 2-1 and 2-2, where the intensity of laser light is about 1.25 GW/m$^2$ or more, the protrusion part is formed on the mask sheet. In the comparative example 1-1, the laser light intensity is less than about 1.25 GW/m$^2$, and even with the same pulse overlap ratio as in the embodiments, the protrusion part was not formed.

Comparing comparative example 2-2 and embodiment 2-3 in Table 2, even when the comparative example has a laser light intensity of about 1.25 GW/m$^2$ or more, the protrusion part was not formed when the pulse overlap rate was less than about 80%.

In the mask manufacturing method of an embodiment, the intensity of the provided laser light is about 1.25 GW/m$^2$ or more, and if the pulse overlap ratio is about 80% or more, it is possible to effectively form a protrusion part.

3. Formation of Protrusion Part According to Line Overlap Ratio

Table 3 shows the formation of the protrusion part of the mask according to the line overlap ratio of the pulse lasers irradiated with the first laser light compared with the comparative example. The wavelength of the first laser light used in comparative example 3-1 and embodiments 3-1 to 3-3 is about 515 nm, and the beam size is about 12 μm.

TABLE 3

| Classi-fication | Number of pro-cessing lines | Intensity of laser light (GW/m$^2$) | Pulse overlap ratio (%) | Fre-quency (Hz) | Line overlap ratio (%) | Height of protru-sion part (μm) |
|---|---|---|---|---|---|---|
| Comparative example 3-1 | 30 | 3.75 | 68 | 7.5k | 68 | X |
| Embodiment 3-1 | 30 | 1.25 | 80 | 12k | 76 | 0.28 |
| Embodiment 3-2 | 30 | 3.75 | 92 | 30k | 76 | 0.31 |
| Embodiment 3-3 | 30 | 3.75 | 92 | 30k | 92 | 5.4~8.5 |

Referring to the results of Table 3, the protrusion part is formed on the mask sheet in case that the line overlap ratio is about 70% or more. In comparison, comparative example 3-1 has a line overlap ratio of less than about 70%, and the line overlap ratio is small compared to embodiments 3-1 to 3-3, and thus the protrusion part was not formed.

Comparing comparative example 3-1 and embodiment 3-2 in Table 3, even when the comparative example has a laser light intensity of 1.25 GW/m² or more, the protrusion part was not formed when the pulse overlap rate was less than about 70%.

In the mask manufacturing method of an embodiment, the intensity of the provided laser light is about 1.25 GW/m² or more, if the line overlap ratio is about 70% or more, it is possible to effectively form a protrusion part.

A method of manufacturing a mask according to an embodiment may include forming a mask support part including a protrusion part by repeatedly irradiating a laser light on a surface of the preliminary mask sheet, and providing a laser light adjacent to the protrusion part to form an opening part to penetrate the preliminary mask sheet, so that it is possible to provide a mask that has high dimensional accuracy of the open area and the mask may minimize the shadow region area on the deposition surface.

In the mask manufacturing method of an embodiment, pulse lasers are overlapped, and the laser light intensity is about 1.25 GW/m² or more, the pulse overlap ratio is about 80% or more, and the line overlap ratio is about 70% or more so that it is possible to manufacture a mask having a high dimensional accuracy of the open area and maintaining the height of the barrier below a certain height.

The mask manufacturing method of an embodiment includes irradiating an overlapping laser light so that the method may be used to manufacture a mask including a protrusion part formed to a selected height or less so as to increase the deposition precision of the deposited functional layers.

The mask manufacturing method of an embodiment includes irradiating laser light to both the upper surface and the lower surface, so that the method may be used for manufacturing a mask that has accurate dimensions in the open area and that minimizes shadow regions in the deposition region.

Embodiments have been disclosed herein, and although terms are employed, they are used and are to be interpreted in a generic and descriptive sense only and not for purpose of limitation. In some instances, as would be apparent by one of ordinary skill in the art, features, characteristics, and/or elements described in connection with an embodiment may be used singly or in combination with features, characteristics, and/or elements described in connection with other embodiments unless otherwise specifically indicated. Accordingly, it will be understood by those of ordinary skill in the art that various changes in form and details may be made without departing from the spirit and scope of the disclosure as set forth in the following claims.

What is claimed is:

1. A mask manufacturing method comprising:
preparing a preliminary mask sheet including a first surface and a second surface facing each other;
forming a mask support part including a concave part recessed from the first surface and a protrusion part adjacent to the concave part and protruding from the first surface by irradiating a first laser light to the first surface of the preliminary mask sheet; where the concave part has a shape that is symmetrical with the protrusion part based on a lower surface of the mask sheet; and
forming an opening part adjacent to the protrusion part and penetrating the preliminary mask sheet by irradiating a second laser light on the second surface of the preliminary mask sheet.

2. The method of claim 1, wherein
the first laser light comprises pulse lasers sequentially provided in a first direction, the pulse lasers including a first pulse laser and a second pulse laser, and
in the forming of the mask support part, at least part of neighboring pulse lasers among the pulse lasers overlap each other.

3. The method of claim 2, wherein
a pulse overlap ratio of the at least part of neighboring pulse lasers is about 80% or more,
the pulse overlap ratio is an overlap ratio of a first pulse width of the first pulse laser and a second pulse width of the second pulse laser,
the first pulse width and the second pulse width are diameters in a cross-section of the first pulse laser and the second pulse laser at an intensity of $I_{max}/e^2$, respectively, and
$I_{max}$ is a maximum intensity of the first pulse laser and of the second pulse laser.

4. The method of claim 2, wherein
a pulse overlap ratio of the at least part of neighboring pulse lasers is about 80% or more,
the pulse overlap ratio is expressed in the following Equation 1, and $$\text{Pulse overlap ratio (\%)} = \left(1 - \frac{v}{PS} \times f\right) \times 100 \qquad \text{[Equation 1]}$$

in Equation 1, v is a scan speed of the first laser light, PS is a diameter of a cross section of a pulse laser among the pulse lasers at an intensity of $I_{max}/e^2$ of the first laser light, f is a frequency of the first laser light, and $I_{max}$ is a maximum intensity of the pulse laser.

5. The method of claim 1, wherein the forming of the mask support part comprises:
irradiating the first laser light to a first line along a virtual first line extending in a first direction;
moving the preliminary mask sheet in a second direction different than the first direction; and
irradiating the first laser light to a second line along a virtual second line extending in the first direction after the moving of the preliminary mask sheet.

6. The method of claim 5, wherein the moving of the preliminary mask sheet and the irradiating of the first laser light to the second line are repeated 9 or more times.

7. The method of claim 5, wherein
the first laser light comprises pulse lasers sequentially provided in the first direction, the pulse lasers including a first pulse laser and a second pulse laser,
a line overlap ratio of a first line pulse laser in the irradiating of the first laser light to the first line and a second line pulse laser in the irradiating of the first laser light to the second line in which a position in the first direction overlaps is about 70% or more,
the line overlap ratio is an overlap ratio of a pulse width of the first line pulse laser in the second direction and a pulse width of the second line pulse laser in the second direction, and the pulse width is a diameter in a cross-section of the first line pulse laser and the second line pulse laser at an intensity of $I_{max}/e^2$, and $I_{max}$ is a maximum intensity of the first line pulse laser and of the second line pulse laser.

8. The method of claim 5, wherein
the first laser light comprises pulse lasers sequentially provided in the first direction, the pulse lasers including a first pulse laser and a second pulse laser,
a line overlap ratio of a first line pulse laser in the irradiating of the first laser light to the first line and a second line pulse laser in the irradiating of the first laser light to the second line in which a position in the first direction overlaps is about 70% or more,
the line overlap ratio is represented by the following Equation 2, and $$\text{Line overlap ratio (\%)} = \left(1 - \Delta X / PS\right) \times 100 \qquad \text{[Equation 2]}$$

in Equation 2, $\Delta X$ is a movement distance of the preliminary mask sheet in the second direction, PS is a pulse width at an intensity of $I_{max}/e^2$ of the first laser light, and $I_{max}$ is a maximum intensity of the first line pulse laser and of the second line pulse laser.

9. The method of claim 1, wherein the first laser light and the second laser light are pulse lasers having a pulse width in a range of femtoseconds ($10^{-15}$) to picoseconds ($10^{-12}$), respectively.

10. The method of claim 1, wherein a wavelength of the first laser light is in a range of about 400 nm to about 600 nm.

11. The method of claim 1, wherein a frequency of the first laser light is in a range of about 10 kHz to about 1000 kHz.

12. The method of claim 1, wherein a beam size of the first laser light is in a range of about 10 μm to about 100 μm.

13. The method of claim 1, wherein an intensity of the first laser light is about 1.25 GW/m² or more.

14. The method of claim 1, wherein
the opening part has a rectangular shape in a plan view, and
the protrusion part is formed side by side along a side of the opening part.

15. The method of claim 1, wherein, in a plan view, the protrusion part forms a closed curve surrounding the opening part at an outside of the opening part.

16. A mask manufacturing method using a laser processing device, comprising:
providing a preliminary mask sheet including a first surface and a second surface facing each other on a stage;
forming a mask support part including a concave part recessed from the first surface and a protrusion part adjacent to the concave part and protruding from the first surface by irradiating a first laser light to the first surface of the preliminary mask sheet while moving the stage in a first direction; where the concave part has a shape that is symmetrical with the protrusion part based on a lower surface of the mask sheet; and
forming an opening part adjacent to the protrusion part and penetrating the preliminary mask sheet by irradiating a second laser light to the second surface of the preliminary mask sheet, wherein the laser processing device includes:
a support part including the stage that is movable in the first direction and in a second direction orthogonal to the first direction, and
a laser light providing part disposed on the support part.

17. The method of claim 16, wherein the providing of the preliminary mask sheet comprises:
tensioning and fixing the preliminary mask sheet to a mask frame; and
seating the preliminary mask sheet on the stage so that the first surface of the preliminary mask sheet fixed to the mask frame is adjacent to the laser light providing part.

18. The method of claim 16, wherein the forming of the mask support part comprises repeatedly irradiating the first laser light in the first direction parallel to a side of a preliminary open area of the preliminary mask sheet formed of the opening part.

19. The method of claim 16, wherein
the first laser light has an intensity of about 1.25 GW/m² or more, and comprises pulse lasers sequentially provided in a first direction, the pulse lasers including a first pulse laser and a second pulse laser,
the forming of the mask support part comprises:
irradiating the first laser light to a first line along a virtual first line extending in the first direction;
moving the preliminary mask sheet in the second direction; and
irradiating the first laser light to a second line along a virtual second line extending in the first direction after the moving of the preliminary mask sheet,
a pulse overlap ratio of the at least part of neighboring pulse lasers among the pulse lasers is about 80% or more,
the pulse overlap ratio is expressed in the following Equation 1, and $$\text{Pulse overlap ratio (\%)} = \left(1 - \frac{v}{PS \times f}\right) \times 100 \qquad \text{[Equation 1]}$$

in Equation 1, v is a scan speed of the first laser light, PS is a pulse width at an intensity of $I_{max}/e^2$ of the first laser light, f is a frequency of the first laser light, and $I_{max}$ is a maximum intensity of the first pulse laser and of the second pulse laser.

20. The method of claim 19, wherein
a line overlap ratio of a first line pulse laser in the irradiating of the first laser light to the first line and a second line pulse laser in the irradiating of the first laser light to the second line in which a position in the first direction overlaps is about 70% or more,
the line overlap ratio is expressed in Equation 2 below, and $$\text{Line overlap ratio (\%)} = \left(1 - \Delta X / PS\right) \times 100 \qquad \text{[Equation 2]}$$

in Equation 2, $\Delta X$ is a movement distance of the preliminary mask sheet in the second direction, and PS is a pulse width at an intensity of $I_{max}/e^2$ of the first laser light.

* * * * *